US012619162B2

(12) United States Patent
Uziel et al.

(10) Patent No.: US 12,619,162 B2
(45) Date of Patent: May 5, 2026

(54) EXTRA TALL TARGET METROLOGY

(71) Applicant: KLA Corporation, Milpitas, CA (US)

(72) Inventors: Yoram Uziel, Milpitas, CA (US); Ariel Hildesheim, Milpitas, CA (US); Alexander Novikov, Milpitas, CA (US); Amnon Manassen, Haifa (IL); Etay Lavert, Milpitas, CA (US); Ohad Bachar, Timrat (IL); Yoav Grauer, Haifa (IL)

(73) Assignee: KLA Corporation, Milpitas, CA (US)

( * ) Notice: Subject to any disclaimer, the term of this patent is extended or adjusted under 35 U.S.C. 154(b) by 970 days.

(21) Appl. No.: 17/715,789

(22) Filed: Apr. 7, 2022

(65) Prior Publication Data

US 2023/0324809 A1 Oct. 12, 2023

(51) Int. Cl.
G03F 7/20 (2006.01)
G03F 7/00 (2006.01)

(52) U.S. Cl.
CPC ...... G03F 7/70633 (2013.01); G03F 7/70666 (2013.01); G03F 7/70775 (2013.01)

(58) Field of Classification Search
CPC ............. G03F 7/70633; G03F 7/70666; G03F 7/70775; G03F 7/706831; G03F 7/706845; G03F 7/706849
See application file for complete search history.

(56) References Cited

U.S. PATENT DOCUMENTS 4,495,407 A 1/1985 Kodama et al.
4,863,252 A 9/1989 McCarthy et al.

9,844,314 B2 12/2017 Charles et al.
10,677,588 B2 6/2020 Hill et al.
11,073,768 B2 7/2021 Hill et al.
2003/0007140 A1* 1/2003 Korenaga ........... G03F 7/70758
355/75
2016/0266503 A1* 9/2016 Van Voorst ......... G03F 7/70633
(Continued)

FOREIGN PATENT DOCUMENTS

JP 2007078748 A 3/2007
TW 201133161 A 10/2011

OTHER PUBLICATIONS

Korean Intellectual Property Office, International Search Report and Written Opinion for International Application No. PCT/US2023/016476, Jul. 19, 2023, 10 pages.
(Continued)

*Primary Examiner* — Mesfin T Asfaw
(74) *Attorney, Agent, or Firm* — Suiter Swantz IP

(57) ABSTRACT

A metrology system includes an imaging system. The imaging system may include an objective lens. The metrology system may include one or more detectors. The metrology system may include an objective positioning stage structurally coupled to the objective lens and configured to adjust a focal plane of at least one of the one or more detectors via movement along an optical axis of the metrology system. The metrology system may include one or more proximity sensors configured to measure lateral positions of a stage element as the objective positioning stage moves along the optical axis. The metrology system may be configured to determine a metrology measurement associated with a target on a sample using the images and lateral positions of the stage element when implementing a metrology recipe.

37 Claims, 10 Drawing Sheets

(56)          References Cited

U.S. PATENT DOCUMENTS

| | | |
|---|---|---|
| 2019/0310080 A1 | 10/2019 | Hill et al. |
| 2021/0072650 A1 | 3/2021 | Feler et al. |
| 2021/0372784 A1 | 12/2021 | Hill et al. |
| 2022/0187718 A1* | 6/2022 | Zach ..................... G01B 11/16 |

OTHER PUBLICATIONS

European Search Report received in EP Application No. 23785174.
6, Jan. 7, 2026, 9 pages.
Taiwan Patent Office, Office Action for Application No. TW112111425
dated Mar. 12, 2026, 78 pages (with Translation).

* cited by examiner

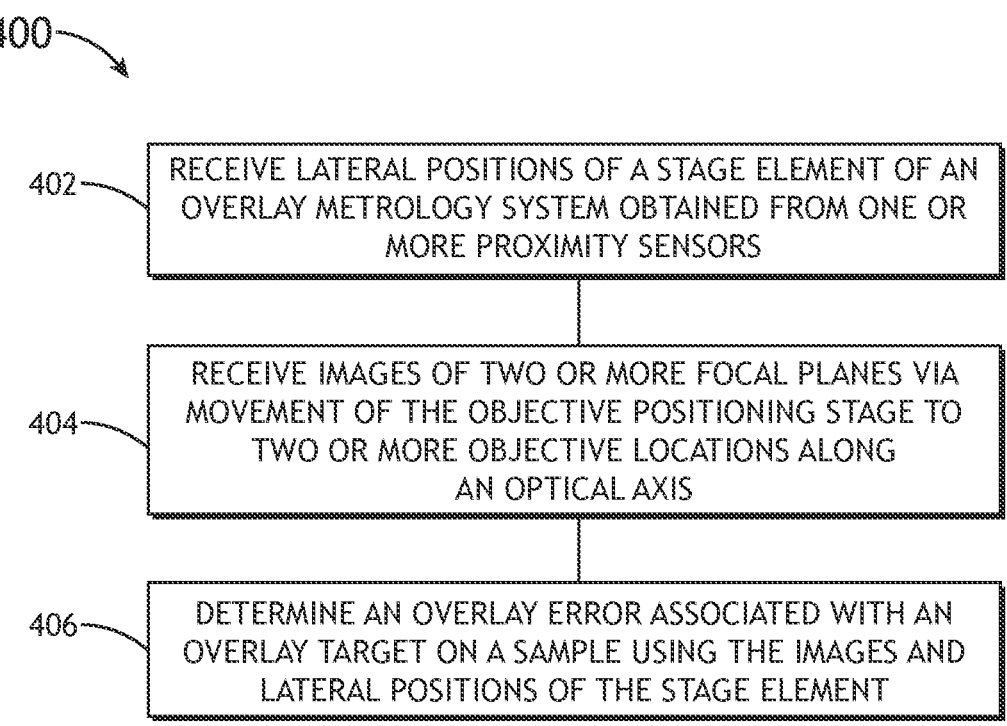

400

402 — RECEIVE LATERAL POSITIONS OF A STAGE ELEMENT OF AN OVERLAY METROLOGY SYSTEM OBTAINED FROM ONE OR MORE PROXIMITY SENSORS

404 — RECEIVE IMAGES OF TWO OR MORE FOCAL PLANES VIA MOVEMENT OF THE OBJECTIVE POSITIONING STAGE TO TWO OR MORE OBJECTIVE LOCATIONS ALONG AN OPTICAL AXIS

406 — DETERMINE AN OVERLAY ERROR ASSOCIATED WITH AN OVERLAY TARGET ON A SAMPLE USING THE IMAGES AND LATERAL POSITIONS OF THE STAGE ELEMENT

FIG.4

EXTRA TALL TARGET METROLOGY

TECHNICAL FIELD

The present disclosure relates generally to metrology and, more particularly, to alignment of metrology systems.

BACKGROUND

In wafer manufacturing, metrology is the field of measurements and may include overlay metrology, critical dimension metrology, and the like.

In the manufacture of wafers, with an increasing number of layers and/or increasing individual layer height (e.g., 3D NAND, die-to-wafer (D2W), wafer-to-wafer (W2W), and the like) comes an increasing height range between layers and/or features of interest. Traditional metrology systems may not have the focal plane adjustment distances needed to image multiple layers and/or features at increasingly higher distances from each other while keeping within alignment tolerances of the imaging system. Further, a metrology system may need to be close to a target feature but may not have the speed and/or height adjustment range needed to move out of the way when moving to the next, significantly taller target feature.

Overlay control is the control of the pattern-to-pattern alignment of multiple layers necessary. Image-based overlay metrology may typically include determining relative overlay error (e.g., misalignment error) between two or more layers of interest on a sample (e.g., wafer) based on relative imaged positions of features of an overlay target in the different layers of interest.

Therefore, it may be desirable to have systems and methods to address the above shortfalls.

SUMMARY

A metrology system for tall metrology is disclosed in accordance with one or more illustrative embodiments of the present disclosure. In one illustrative embodiment, the system includes an objective lens. In another illustrative embodiment, the system includes one or more detectors. In another illustrative embodiment, the system includes an objective positioning stage structurally coupled to the objective lens and configured to adjust a focal plane of at least one of the one or more detectors via movement along an optical axis, the metrology system including the optical axis. In another illustrative embodiment, the system includes one or more proximity sensors configured to measure lateral positions of a stage element as the objective positioning stage moves along the optical axis. In another illustrative embodiment, the metrology system is configured to capture images of two or more focal planes via movement of the objective positioning stage to two or more objective locations along the optical axis, each focal plane of the two or more focal planes at an axial position along the optical axis of the metrology system and orthogonal to the optical axis. In another illustrative embodiment, at least two of the two or more focal planes are separated by an axial focal distance apart that is greater than a depth of field provided by the objective lens. In another illustrative embodiment, the metrology system is configured to determine a metrology measurement associated with a target on a sample using the images and lateral positions of the stage element when the objective positioning stage is at the two or more objective locations when implementing a metrology recipe, the target including features on the two or more focal planes according to the metrology recipe.

A metrology system for tall metrology with air bearings is disclosed in accordance with one or more illustrative embodiments of the present disclosure. In one illustrative embodiment, the system includes a coarse stage of an objective positioning stage, the coarse stage structurally supported radially about the optical axis by one or more air bearings configured to allow for a longitudinal movement of the coarse stage along the optical axis, and constrain a lateral translation and a tilt of the coarse stage relative to the optical axis when adjusting a focal plane of one or more detectors.

A method for tall overlay metrology is disclosed in accordance with one or more illustrative embodiments of the present disclosure. In one illustrative embodiment, the method includes receiving lateral positions of a stage element of a metrology system obtained from one or more proximity sensors, the lateral positions measured relative to an optical axis. In another illustrative embodiment, the metrology system is configured to adjust a focal position of at least one of one or more detectors of the metrology system, where the metrology system is configured to capture images of two or more focal planes via movement of an objective positioning stage to two or more objective locations along the optical axis, each focal plane of the two or more focal planes at an axial position along the optical axis of the metrology system and orthogonal to the optical axis, where at least two of the two or more focal planes are separated by an axial focal distance apart that is greater than a depth of field provided by an objective lens. In another illustrative embodiment, the method includes receiving the images of the two or more focal planes via movement of the objective positioning stage to the two or more objective locations along the optical axis. In another illustrative embodiment, the method includes determining a metrology measurement associated with a target on a sample using the images and lateral positions of the stage element when the objective positioning stage is at the two or more objective locations, the target including features on the two or more focal planes.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

FIG. 4 illustrates a flowchart of a method for overlay metrology, in accordance with one or more embodiments of the present disclosure.

DETAILED DESCRIPTION

Figure 1A:
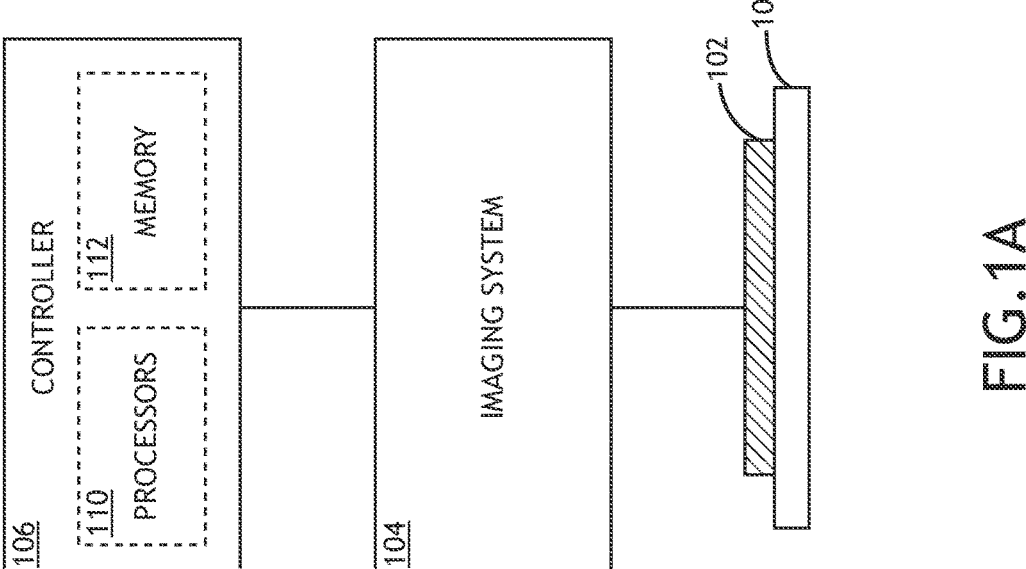
FIG. 1A illustrates a diagrammatic representation of a metrology system, in accordance with one or more embodiments of the present disclosure.
Figure 1A:

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Referring generally to FIGS. 1 through 4, systems and methods for tall metrology are disclosed, in accordance with one or more embodiments of the present disclosure. Embodiments of the present disclosure are directed to providing a metrology system capable of tall metrology. Tall metrology may include any type of metrology (e.g., critical dimension (CD) metrology, overlay metrology generally, scatterometry overlay metrology (SCOL), diffraction based overlay (DBO), and/or the like) known in the art such as, but not limited to, single wafer, D2W, W2W, and/or the like with tall features and/or features at a relatively far (e.g., more than 15 microns) focal distance from each other. It should be noted that some embodiments of the present disclosure allow for tall metrology by virtue of one or a combination of the following: an increased focal plane adjustment distance capability, increased focal plane axial position change speed, alignment sensors (e.g., proximity sensors), stage element adjustment stages, and/or more accurate alignment structure (e.g., thin flexure arms and/or air bearings). In at least some embodiments, benefits of one or a combination of the above may include: more accurate overlay error (e.g., misregistration measurement between features in different layers of a sample), more accurate critical dimensions (e.g., location and/or size of a feature) in a CD metrology system, faster movement of focal planes, more accurate alignment of optical elements of a metrology system, larger range of focal plane adjustment distance, and the like.

Some embodiments of the present disclosure are directed to a metrology system with one or more proximity sensors for measuring one or more lateral positions of a stage element of the metrology system to at least determine/generate a misalignment of the stage element. For example, the one or more proximity sensors may allow for one or more lateral measurements to be determined that can be used to measure a misalignment (e.g., lateral shift and/or tilt) of a stage element.

For example, generally, some embodiments of the present disclosure are directed to a metrology system having an objective lens, one or more detectors, an objective positioning stage, and one or more proximity sensors. For instance, the objective positioning stage may be structurally coupled to the objective lens (or include the objective lens) and be configured to adjust a focal plane of at least one of the one or more detectors via movement along an optical axis of the metrology system. In another instance, the metrology system may be configured to capture images of two or more focal planes via movement of the objective positioning stage (e.g., when adjusting a focal plane) to two or more objective locations along the optical axis, each focal plane of the two or more focal planes at an axial position along the optical axis of the metrology system and orthogonal to the optical axis. For instance, at least two of the two or more focal planes may be separated by an axial focal distance apart that is greater than a depth of field provided by the objective lens (e.g., not all features located at all focal planes may be imaged in focus at the same time). In another instance, or continuing the above instance, the metrology system (e.g., an overlay metrology system, a critical dimension (CD) metrology system, or the like) may be configured to determine a metrology measurement (e.g., overlay error, critical dimension, and the like) associated with a target (e.g., overlay target, critical dimension target, and the like) on a sample using the images and lateral positions of the stage element when the objective positioning stage is at the two or more objective locations (e.g., corresponding to two or more focal planes) when implementing a metrology recipe, and the target may include features (e.g., overlay target features, or any other feature to be measured) on the two or more focal planes according to the metrology recipe.

Further in regards to the above example, embodiments may be directed to metrology systems with imaging system(s), and one or more detectors configured to capture images through an objective lens at two or more focal positions along an optical axis of the imaging system, where the one or more proximity sensors measure one or more lateral positions of a stage element (e.g., coarse stage, fine stage, and the like) of the metrology system. For instance, in a nonlimiting example, the one or more proximity sensors may measure one or more lateral positions of a coarse stage and the one or more lateral positions may be used to at least partially correct an inaccuracy in a determined metrology measurement of a sample caused by at least one of a measured coarse stage lateral shift or a measured coarse stage tilt. In another example, the one or more proximity sensors may measure one or more lateral positions of a fine stage and the one or more lateral positions may be used to at least partially prevent an inaccuracy in a metrology measurement by mechanically compensating for a misalignment in the measured one or more lateral positions before measurement images are captured. At least some benefits of at least some of the embodiments include a faster focal height adjustment, more accurate alignment during focal height adjustment, and/or larger range of focal height adjustments (e.g., which may be made possible by more accurate stage element alignment). For instance, at least some embodiments allow for at least partially correcting for (e.g., mathematically) (or preventing/compensating) optical axis misalignment of one or more elements (e.g., stage elements) of an imaging system by, but not limited to, mathematically adjusting a calculated/determined metrology measurement based on a measured shift of a stage element, or mechanically adjusting (e.g., directing the imaging system to adjust) a mechanical component to at least partially correct for (e.g., compensate for) a measured shift of a stage element (e.g., coarse stage, fine stage, and the like). Note that "stage element" is not limited to only terms using the word "stage" and may include any stage element of the metrology system, such as the objective lens (e.g., objective lens subsystem), frame, or the like.

Additional embodiments are directed to metrology systems with imaging systems with thin flexure arms supporting a stage element of the imaging system. For example, some embodiments of the present disclosure are directed to a metrology system including an imaging system having two or more thin flexure arms supporting a fine stage. The thin flexure arms may be configured to allow for a longitudinal movement of the fine stage along an optical axis, and constrain a lateral translation and a tilt of the fine stage relative to the optical axis when adjusting the focal position of a detector. At least some of the benefits include fast, accurate (i.e. reduced misalignment relative to the optical axis), and a larger range of height adjustment (e.g., focal plane adjustment distance). Further, a misalignment of the fine stage may be repeatable. In an optional configuration, one or more proximity sensors are used to measure one or more lateral positions of a stage element at different focal positions associated with a movement of the fine stage. Further, a calibration of a repeatable misalignment error (e.g., lateral shift and/or tilt) of the fine stage may be determined. Further still, the calibration may be used to correct, at least partially, a metrology measurement. For example, the calibration may be used to mathematically correct for the metrology measurement and/or mechanically correct for the metrology measurement (e.g., using a fine adjustment stage).

Further embodiments are directed to metrology systems with an imaging system with one or more bearings supporting a stage element of the imaging system. For example, some embodiments of the present disclosure are directed to a metrology system including an imaging system having one or more air bearings supporting a coarse stage. The air bearings may be configured to allow for a longitudinal movement of the coarse stage along an optical axis, and constrain a lateral shift and a tilt of the coarse stage relative to the optical axis when adjusting the focal plane axial position of a detector (e.g., moving the coarse stage). In some embodiments, at least some of the benefits include fast, accurate (i.e. reduced misalignment relative to an optical axis), and a larger range of height adjustment (e.g., focus position height adjustment).

Additional embodiments are directed to metrology systems with imaging systems having two or more detectors (e.g., cameras) and at least one of thin flexure arms, air bearings, and/or two or more proximity sensors. For example, some embodiments of the present disclosure are directed to a metrology system including an imaging system having two or more detectors, where the imaging system includes one or more proximity sensors and at least one of 1) two or more thin flexure arms or 2) one or more air bearings supporting a stage element (e.g., a fine stage, and/or a coarse stage).

It should be noted that a determined (e.g., calculated, generated, and the like) metrology measurement may itself be inaccurate for a variety of reasons. For example, a metrology measurement may be inaccurate due to, but not limited to, a lack of resolution and/or focus of the imaging tool or a shift of one or more components (e.g., stage elements) of the imaging system out of alignment (e.g., a shift over time; and/or a shift caused by an operation (e.g., change in axial position of a stage element) of the imaging system). For instance, an error (e.g., inaccuracy) in a metrology measurement may be a combination of errors caused by, but not limited to, a shift caused by adjusting a axial position of a stage element (e.g., fine stage, coarse stage, and the like), a shift due to flexibility (e.g., non-stiffness) in an element of an imaging system (e.g., a frame, or stiff plate), a shift due to an unconstrained tolerance gap between two or more imaging system elements (e.g., gap between a coarse stage and bearings supporting the coarse stage), a tool-induced shift (TIS), a shift caused by environment and/or metrology system vibrations (e.g., jitter), and the like. These errors in metrology measurement may affect measurement efficiency/accuracy of the metrology process and therefore the manufacturing and/or inspection process of a sample. These errors may also limit the maximum focal plane adjustment distance (measured between features) of a metrology system because increasing the maximum focal plane adjustment distance (e.g., without the benefit of this disclosure) may cause the metrology system to have an unacceptable alignment error causing an unacceptable inaccuracy in the metrology measurement (e.g., being out of specification requirements of tolerance).

It should be noted that a focal plane refers to the plane or volume that is in focus by an imaging system (e.g., imaging system 104). For example, an imaging system may, via a positioning stage (e.g., objective positioning stage), allow for a range of focal planes spanning a maximum focal plane adjustment distance of the imaging system. At least some embodiments of the present disclosure allow for an imaging system 104 with increased maximum focal plane adjustment distance and which is adjustable within required alignment tolerances. For example, in some embodiments, the present disclosure allows for a metrology system 100 with a maximum focal plane adjustment distance of at least 1000 microns (e.g., by enabling the measure of misregistration between layers located one above the other at a distance of at least 1000 microns in overlay metrology) and operating within tolerance limits of 3 nanometers of lateral shift and 3 micro-radians of tilt.

Further, the required maximum focal plane adjustment distance (e.g., which may be measured normal to a wafer surface (e.g., the wafer surface facing the imaging system), and/or parallel to an ideal/designed-for optical axis) between different focal planes of different features may be ever-increasing due to reasons including, but not limited to, increasing total number of layers per sample, and higher individual layer heights (e.g., 3D NAND, Thin Film Head (TFH)). In this regard, a stage element may need to travel a distance corresponding to a maximum focal plane adjustment distance (e.g., measured between focal planes of the metrology system and/or features of the sample) and/or an axial adjustment distance (e.g., distance that the stage element moves along the optical axis) that is larger than a traditional system is capable of. An inability of being able to travel such a corresponding distance may include, but is not limited to, detriments of inadvertently contacting a tall target feature when traversing the sample, and not being able to accurately image both tall (high) and short (low) target features efficiently and/or at all (e.g., due to lack of focal adjustment range).

Accordingly, embodiments of the present disclosure are directed to a system and method which cure one or more of the shortfalls of previous approaches.

FIG. 1A illustrates a diagrammatic representation of a metrology system, in accordance with one or more embodiments of the present disclosure. For example, the metrology system 100 may determine metrology measurement between two or more layers of a sample 102 based on images of one or more features of the sample 102 according to a metrology recipe.

In one embodiment, the metrology system 100 includes an imaging system 104 configured to capture one or more images of the sample 102 and a controller 106 to determine metrology measurement of two or more layers of the sample 102 based on images from the imaging system 104 according to a metrology recipe. Further, metrology system 100 may include a sample stage 108 for positioning the sample 102 within a field of view (e.g., the area below the objective lens) of the imaging system 104 for the determination of metrology measurement. The sample stage 108 may include any system suitable for positioning the sample 102 within the metrology system 100. For example, the sample stage 108 may include any combination of linear translation stages, rotational stages, tip/tilt stages or the like.

In at least one embodiment, the metrology system 100 may include one or more imaging systems 104. In another embodiment, the metrology system 100 may include, but is not limited to, a controller 106, including one or more processors 110 and a memory 112, and a sample stage 108. The imaging system 104 may include any imaging system 104. In one embodiment, the controller 106 is communicatively coupled to an imaging system 104 (e.g., the imaging system 104 shown in FIG. 1B and described in more detail below). In this regard, the one or more processors 110 of the controller 106 may be configured to generate one or more control signals configured to adjust one or more characteristics of the imaging system 104 according to a metrology recipe.

Figure 1B:
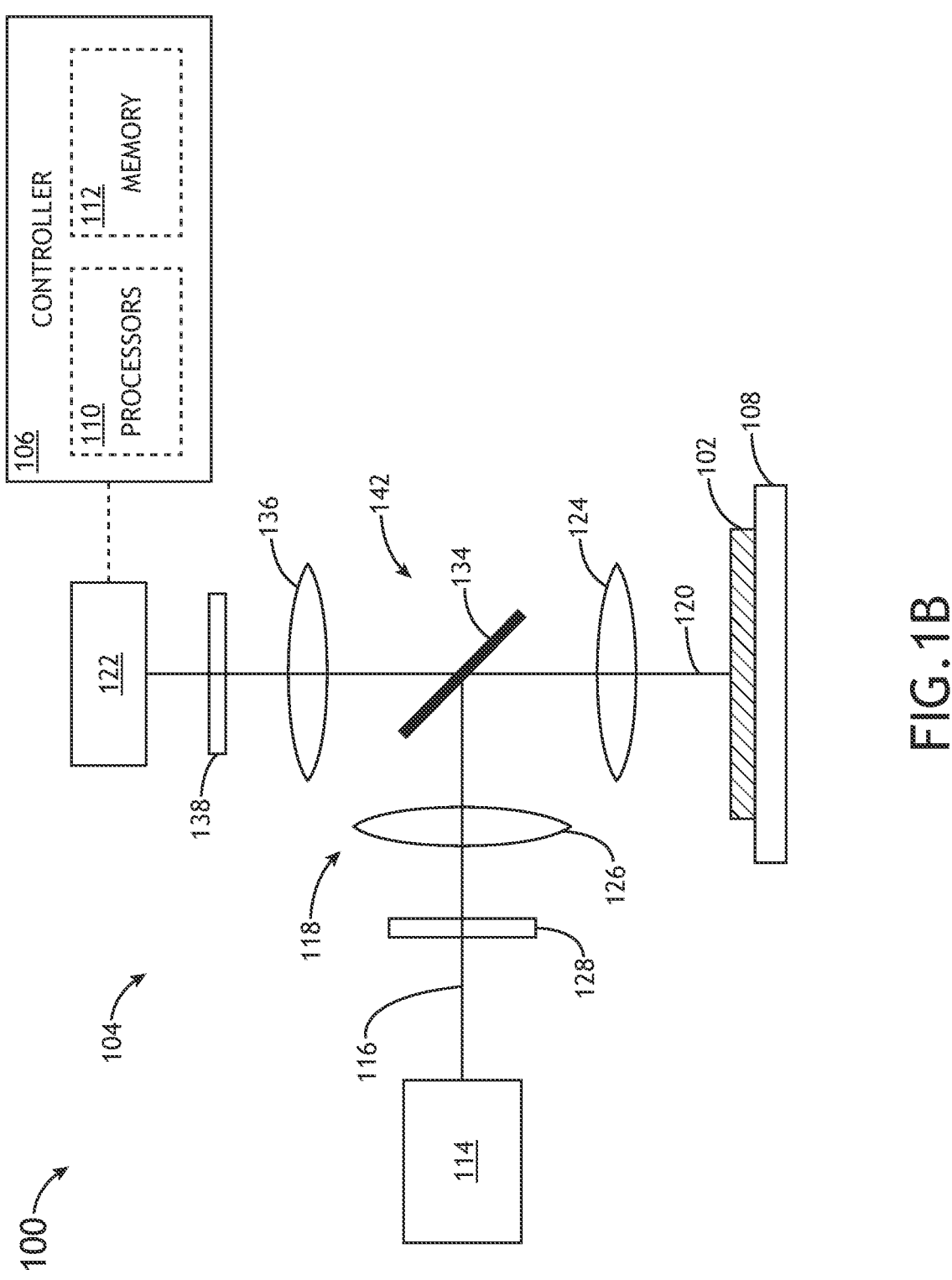
FIG. 1B illustrates a diagrammatic representation of a metrology system, in accordance with one or more embodiments of the present disclosure.

FIG. 1B illustrates a diagrammatic representation of a metrology system, in accordance with one or more embodiments of the present disclosure.

In one embodiment, the metrology system 100 includes an illumination source 114 to generate an illumination beam 116, an illumination pathway 118 (which may be one or more illumination optics) to direct the illumination beam 116 (e.g., at least a portion of light of the illumination beam) to the sample 102 mounted on the sample stage 108, a collection pathway 142 to direct radiation emanating from the sample 102 to a detector assembly 122. For example, the detector assembly 122 may include one or more detectors suitable for capturing an image of the sample 102. The optical axis of the imaging system may be split into multiple optical axes for each detector or be separate optical axes.

The illumination beam 116 may include one or more selected wavelengths of light including, but not limited to, vacuum ultraviolet radiation (VUV), deep ultraviolet radiation (DUV), ultraviolet (UV) radiation, visible radiation, SWIR, or infrared (IR) radiation. The illumination source 114 may further generate an illumination beam 116 including any range of selected wavelengths. In another embodiment, the illumination source 114 may include a spectrally-tunable illumination source to generate an illumination beam 116 having a tunable spectrum. The illumination source 114 may further produce an illumination beam 116 having any temporal profile. For example, the illumination source 114 may produce a continuous illumination beam 116, a pulsed illumination beam 116, or a modulated illumination beam 116. Additionally, the illumination beam 116 may be delivered from the illumination source 114 via free-space propagation or guided light (e.g. an optical fiber, a light pipe, or the like).

The illumination source 114 may include any type of illumination source suitable for providing an illumination beam 116. In one embodiment, the illumination source 114 is a laser source. For example, the illumination source 114 may include, but is not limited to, one or more narrowband laser sources, a broadband laser source, a supercontinuum laser source, a white light laser source, or the like. In this regard, the illumination source 114 may provide an illumination beam 116 having high coherence (e.g., high spatial coherence and/or temporal coherence). In another embodiment, the illumination source 114 includes a laser-sustained plasma (LSP) source. For example, the illumination source 114 may include, but is not limited to, a LSP lamp, a LSP bulb, or a LSP chamber suitable for containing one or more elements that, when excited by a laser source into a plasma state, may emit broadband illumination. In another embodiment, the illumination source 114 includes a lamp source. For example, the illumination source 114 may include, but is not limited to, an arc lamp, a discharge lamp, an electrodeless lamp, or the like. In this regard, the illumination source 114 may provide an illumination beam 116 having low coherence (e.g., low spatial coherence and/or temporal coherence).

In another embodiment, the illumination source 114 directs the illumination beam 116 to a sample 102 via the illumination pathway 118. For example, the illumination pathway 118 may include an objective lens 124 to focus the illumination beam 116 onto the sample 102. The illumination pathway 118 may include one or more illumination optics including one or more illumination pathway lenses 126 and/or illumination conditioning components 128 suitable for modifying and/or conditioning the illumination beam 116. For example, the one or more illumination conditioning components 128 may include, but are not limited to, one or more polarizers, one or more filters, one or more beam splitters, one or more diffusers, one or more homogenizers, one or more apodizers, or one or more beam shapers. By way of another example, the illumination pathway 118 may include aperture stops to control the angle of illumination on the sample 102 and/or field stops to control the spatial extent of illumination on the sample 102.

In another embodiment, the collection pathway 142 (which may be one or more collection optics) may include any number of stage elements to collect radiation emanating from the sample (e.g., in response to the illumination beam 116) and direct the collected radiation (e.g., collection beam 120) to the detector assembly 122. In one embodiment, the collection pathway 142 includes a beamsplitter 134 oriented such that the objective lens 124 may simultaneously direct the illumination beam 116 to the sample 102 and collect radiation from the sample 102. The collection pathway 142 may include one or more collection pathway lenses 136, and/or conditioning collection components 138 suitable for modifying and/or conditioning the radiation from the sample 102 such as, but not limited to, one or more filters, one or more polarizers, or one or more beam blocks. Additionally, the collection pathway 142 may include aperture stops to control the angular extent of radiation collected from the sample 102 and/or field stops to control the spatial extent of an image of the sample 102. In another embodiment, the collection pathway 142 includes a stop. For example, the stop may include a collection aperture stop located in a plane conjugate to the back focal plane of the objective lens 124 and/or a tube lens (not shown) to provide image-space telecentricity when imaging the sample 102. By way of another example, the stop may include a collection field stop located at a plane conjugate to the sample 102 to control the spatial extent of the image on the detector assembly 122. Further, the collection pathway 142 may include any number of illumination pathway lenses 126 that facilitate placement of the stop and the collection field stop at convenient locations.

The detector assembly 122 may include any number of detectors suitable for capturing radiation emanating from the sample 102. For example, the detector assembly 122 may include one or more imaging detectors suitable for generating images at selected focal positions. For instance, an imaging detector may include, but is not limited to, a charge-coupled device (CCD), a complementary metal-oxide-semiconductor (CMOS) device, a time delay imaging (TDI) detector, one or more photomultiplier tubes (PMT), one or more avalanche photodiodes (APD), or the like. In another embodiment, the detector assembly 122 may include a spectroscopic detector suitable for identifying wavelengths of radiation emanating from the sample 102. In another embodiment, the detector assembly 122 may include a short wave infrared (SWIR) detector. For example, the detector assembly 122 (e.g., detector) is a SWIR with quantum dot technology. In another example, the detector assembly 122 (e.g., detector) is a SWIR focal plane array (FPA).

The one or more illumination optics may be configured to direct illumination (e.g., illumination beam 116) from an illumination source 114 to a sample 102 through the objective lens 124 when implementing a metrology recipe, where the sample 102 in accordance with the metrology recipe may include one or more first target features and one or more second target features, where the one or more first target features and the one or more second target features may be separated by a focal plane adjustment distance which is measured between target features and which may be greater than a depth of field of the illumination provided by the objective lens 124.

Figure 2A:
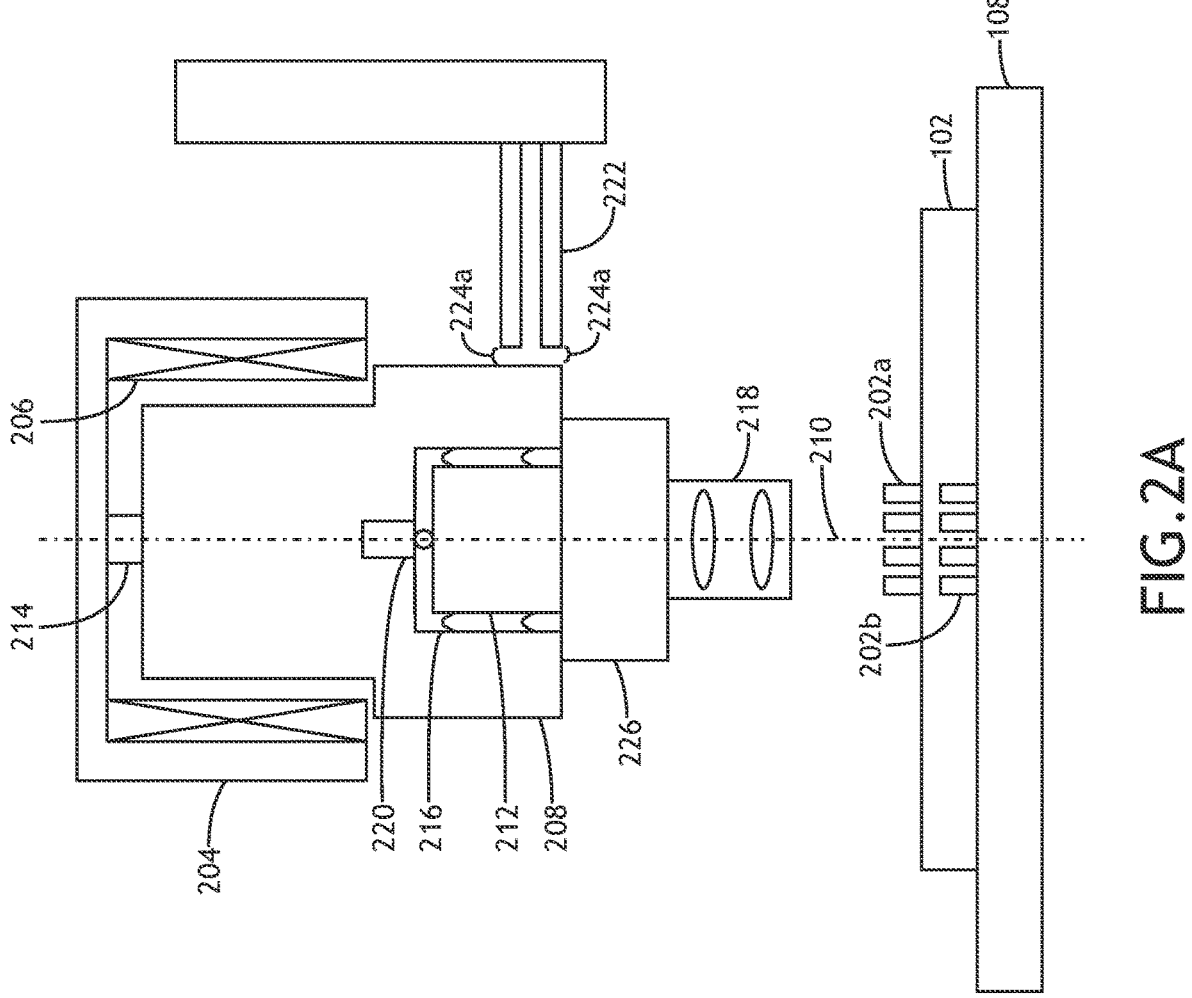
FIG. 2A illustrates a diagrammatic representation of an imaging system in a first position, in accordance with one or more embodiments of the present disclosure.

Referring now to FIGS. 2A through 3C, a metrology system that at least partially corrects for misalignment of stage elements, prevents misalignment of stage elements, and/or allows for tall metrology is generally described. Note that the components shown in FIG. 2A compared to FIG. 3A are for illustrative purposes only and, for example, an embodiment may include some or all components from both FIG. 2A and FIG. 3A. For instance, at least one embodiment the metrology system includes both a fine adjustment stage 226 and a coarse adjustment stage 228, and another embodiment includes neither but does include the proximity sensors 222.

Figure 2B:
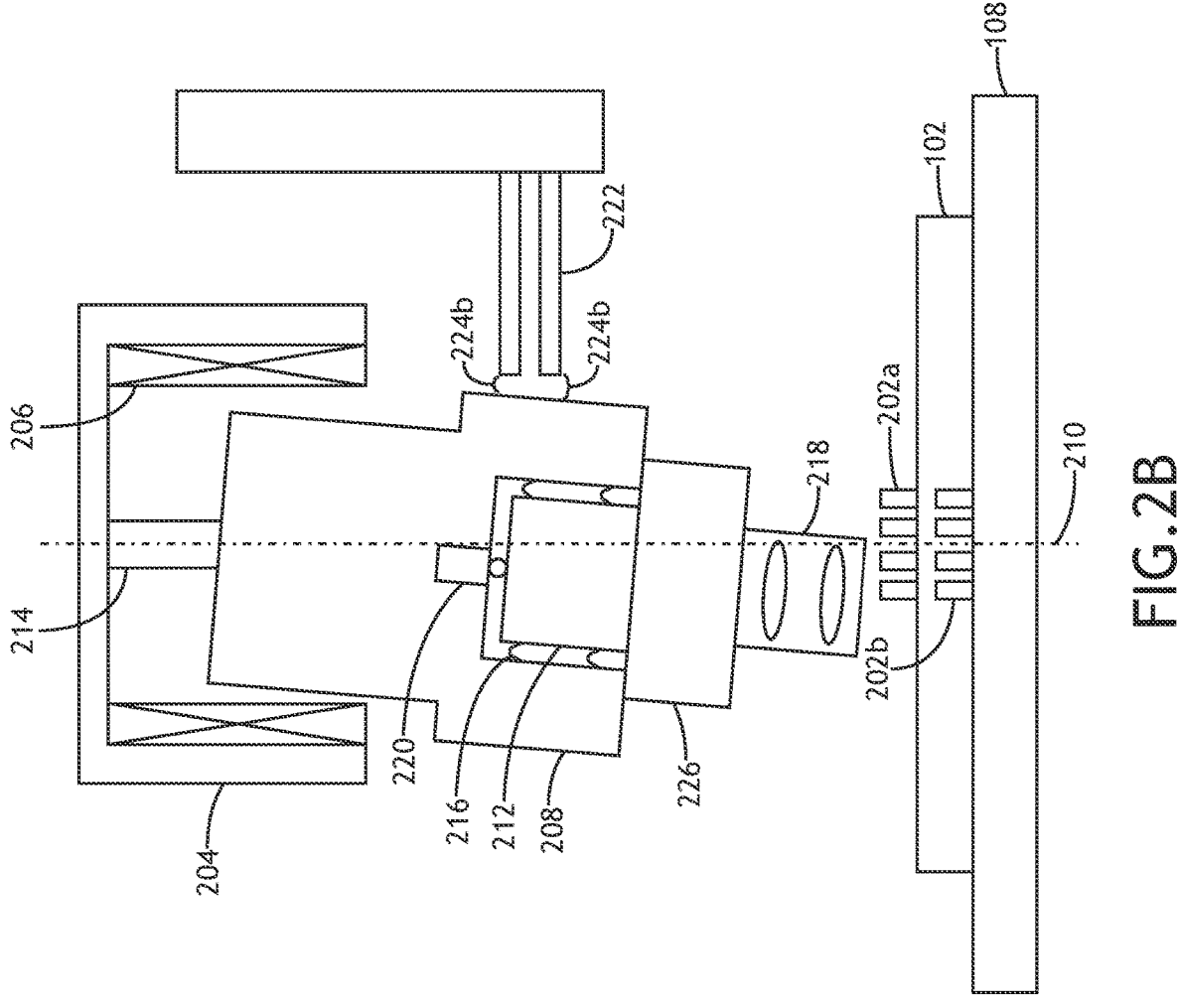
FIG. 2B illustrates a diagrammatic representation of the imaging system in a second misaligned position, in accordance with one or more embodiments of the present disclosure.
Figure 2C:
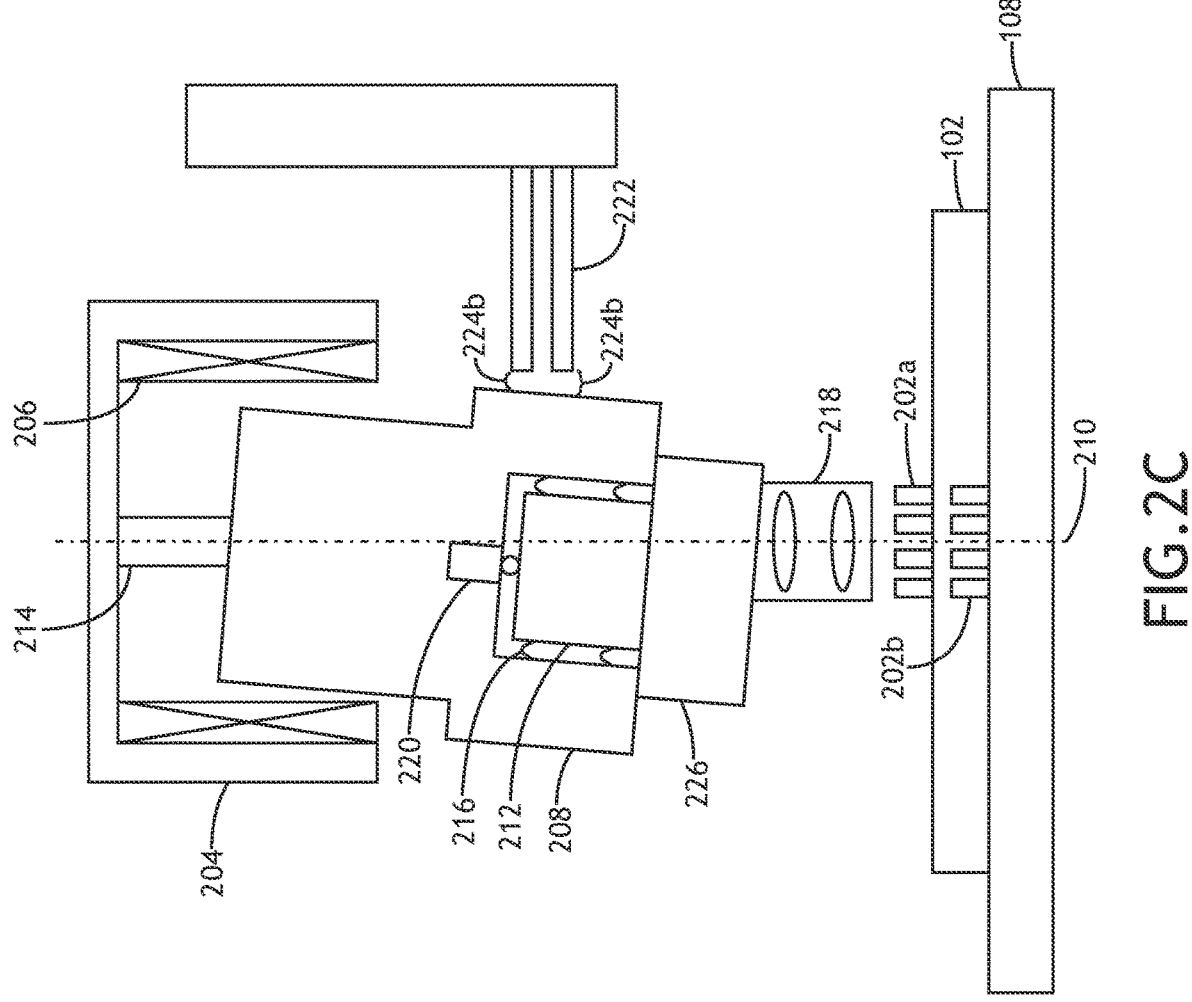
FIG. 2C illustrates a diagrammatic representation of the imaging system in a third position which is at least partially corrected by a fine adjustment stage, in accordance with one or more embodiments of the present disclosure.

FIGS. 2A through 2B illustrate a diagrammatic representation of an imaging system 104 in a first position (FIG. 2A) and in a second, lower (misaligned) position (FIG. 2B). FIG. 2C is the imaging system 104 in a similar lower position as FIG. 2B, except that the misalignment (lateral shift and tilt) of the objective lens 218 is mechanically-corrected by a fine adjustment stage 226. It should be noted that misalignment shown in FIGS. 2A through 3C is exaggerated for illustrative purposes and the imaging system 104 may still be able to properly image (e.g., in focus and in the field of view) overlay targets 202 in the second positions shown in FIGS. 2B and 3B.

Figure 3A:
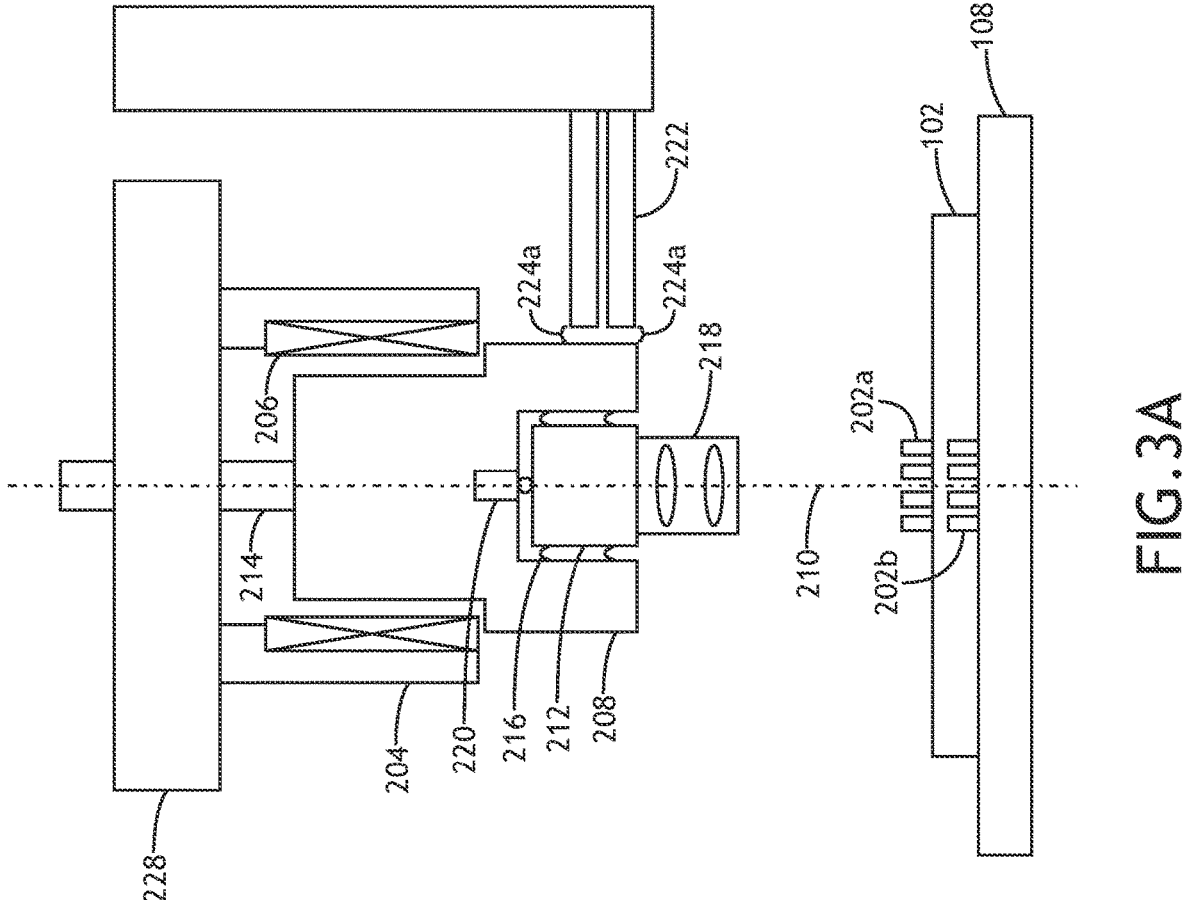
FIG. 3A illustrates a diagrammatic representation of an imaging system in a first position, in accordance with one or more embodiments of the present disclosure.
Figure 3B:
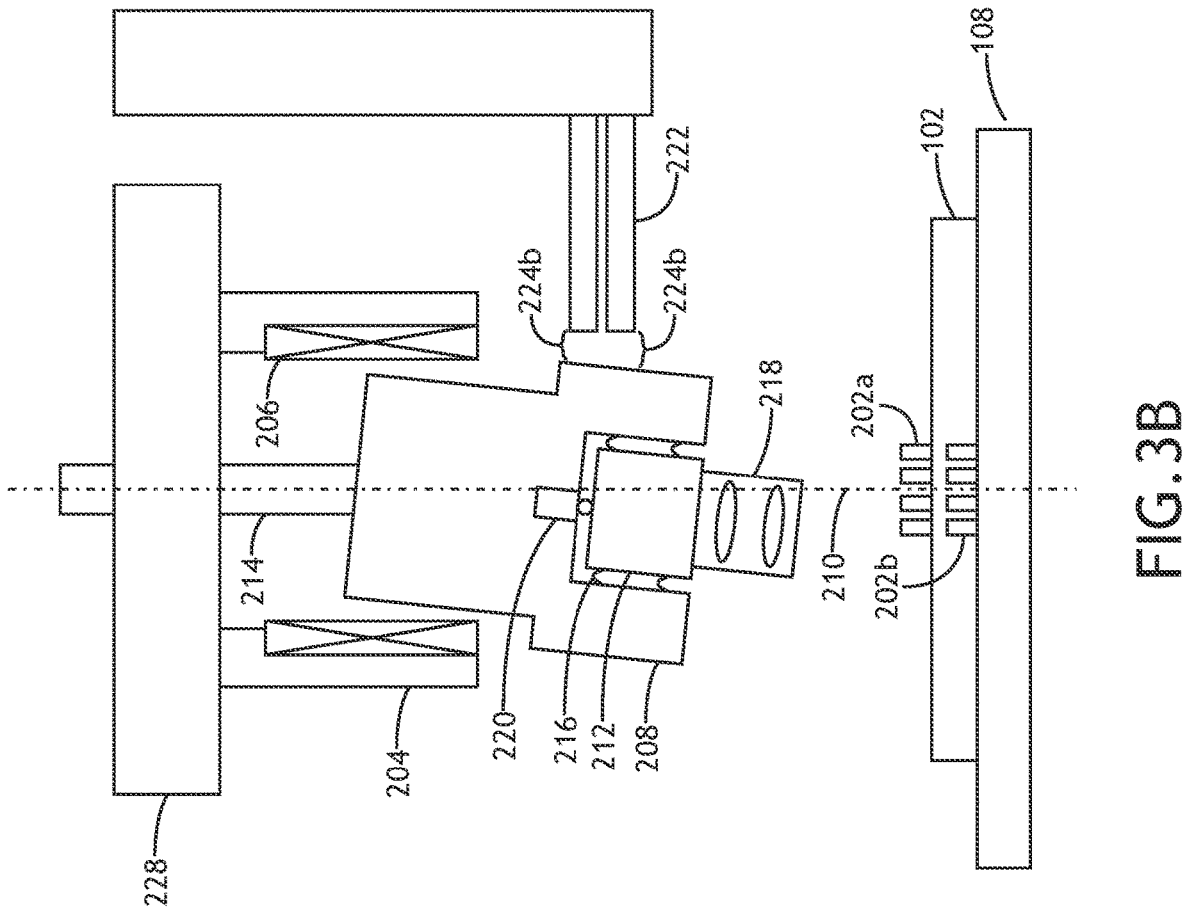
FIG. 3B illustrates a diagrammatic representation of the imaging system in a second misaligned position, in accordance with one or more embodiments of the present disclosure.
Figure 3C:
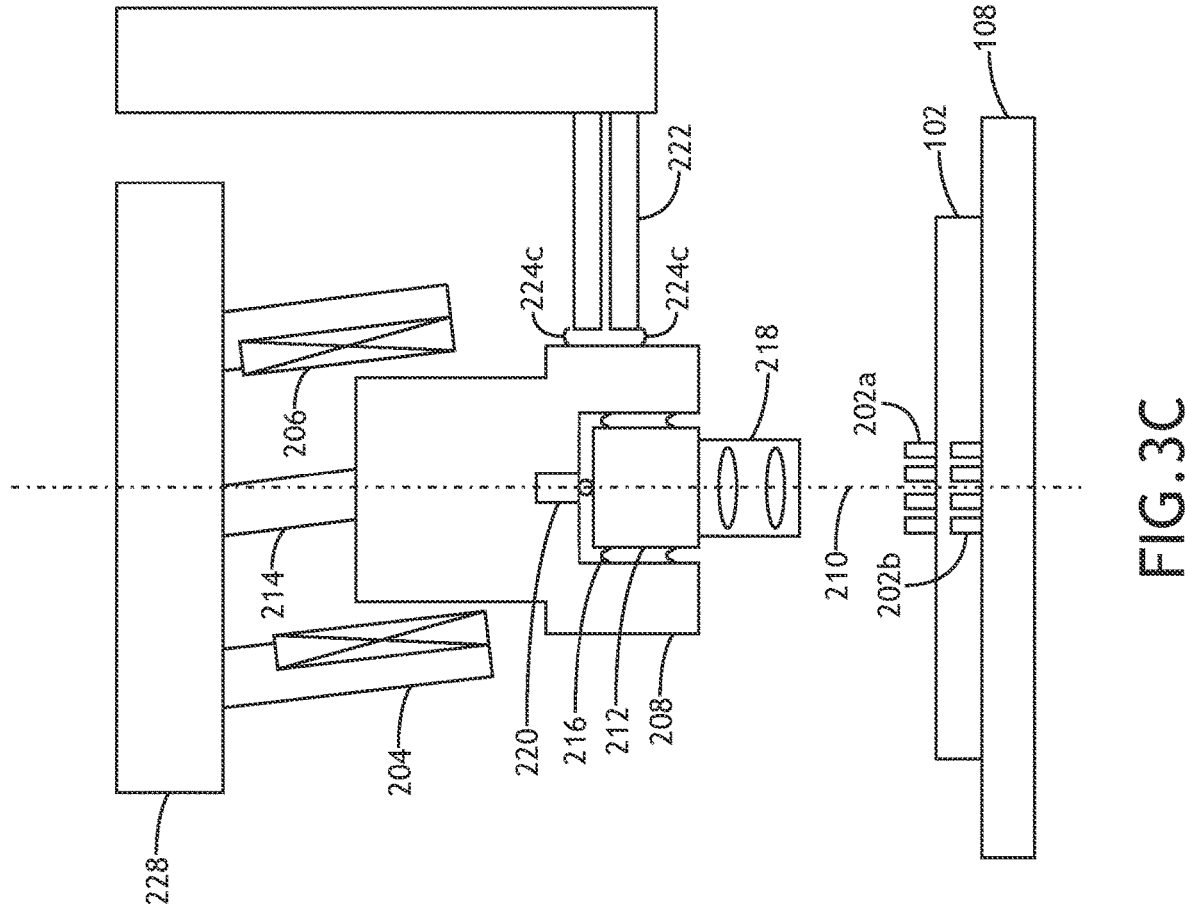
FIG. 3C illustrates a diagrammatic representation of the imaging system in a third position which is at least partially corrected by a coarse adjustment stage, in accordance with one or more embodiments of the present disclosure.

Note that the positions of the imaging system 104 in FIGS. 3A through 3C are similar to those of FIGS. 2A through 2C, except that in FIGS. 3A through 3C the misalignment of the objective lens 218 is mechanically-corrected by a coarse adjustment stage 228 (shown near the frame 204 and coarse stage 208) rather than a fine adjustment stage 226 (shown near the objective lens 218 in FIGS. 2A through 2C).

FIG. 2A illustrates a diagrammatic representation of an imaging system 104 in a first position (e.g., first focal position/configuration), in accordance with one or more embodiments of the present disclosure.

The metrology system 100 may include an imaging system 104 and sample stage 108. The metrology system 100 may include an objective lens 218, one or more detectors, an objective positioning stage, and/or one or more proximity sensors 222.

For example, the imaging system 104 may include: an objective lens 218; one or more detectors configured to capture images through the objective lens 218 at two or more focal positions along an optical axis 210 of the imaging system 104; a detector of the one or more detectors; one or more illumination optics configured to direct illumination from an illumination source to a sample 102 through the objective lens 218 when implementing a metrology recipe, where the sample 102 in accordance with the metrology recipe may include one or more first target features 202a and one or more second target features 202b, where the one or more first target features 202a and the one or more second target features 202b may be separated by a focal plane adjustment distance which may be is greater than a depth of field of the objective lens 218; a coarse stage 208 structurally coupled to a fine stage 212; the fine stage 212 structurally coupled to the objective lens 218; and one or more proximity sensors 222 configured to measure a lateral position of a stage element, where the stage element is at least one of the fine stage 212 or the coarse stage 208.

In at least one embodiment, the imaging system 104 may be configured to allow for a maximum focal plane adjustment distance. The maximum focal plane adjustment distance may be one of, or a combination of, at least a maximum coarse adjustment or a maximum fine adjustment. For example, the maximum height difference between target features that the metrology system may be capable of capturing in focus may be limited by a combination of a coarse adjustment (e.g., coarse focal plane adjustment distance) provided by a coarse stage 208 and a fine adjustment (e.g., fine focal plane adjustment distance) provided by a fine stage 212.

In one embodiment, a sample 104 including one or more layers and one or more target features 202 (e.g., the one or more first target features 202a and the one or more second target features 202b) may be capable of being imaged by the imaging system 104. For example, a target may include one or more first-layer features 202a on a first layer of the sample 102 and one or more second-layer features 202b on a second layer of the sample 102. In this regard, the metrology measurement (i.e., misregistration/misalignment) between the first layer and the second layer may be determined based on the relative positions of the first-layer features 202a and the second-layer features 202b. For example, a target may include features 202 on two or more focal planes of the metrology system 100 according to the metrology recipe. For instance, a first focal plane may align with first-layer features 202a.

In some embodiments, the imaging system 104 may include a frame 204. For example, the frame 204 may structurally support one or more coarse stage support elements 206 (e.g., bearings 206).

For example, the one or more coarse stage support elements 206 may be one or more bearings 206, which may be one or more air bearings 206, roller bearings 206, or the like.

In this regard, air bearings 206 may provide support (e.g., structural) at a tight tolerance to the coarse stage 208. In one example, the one or more bearings 206 (e.g., air bearings) may be operationally coupled to the coarse stage 208. For example, the one or more bearings 206 (e.g., air bearings) may constrain a coarse stage 208 along an optical axis 210 (e.g., allowing longitudinal movement along the optical axis 210 and constraining lateral movement and tilt of the coarse stage 208 relative to the optical axis 210). In another example, the alignment of the fine stage 212 may depend on the alignment of the coarse stage 208 when the fine stage 212 is structurally supported by the coarse stage 208. For instance, the one or more bearings 206 may structurally support a fine stage 212 by virtue of supporting a coarse stage 208 which structurally supports the fine stage 212 and the alignment tolerance of the fine stage 212 may be a function of the alignment tolerance of the coarse stage 208. In this regard, the one or more bearings 206 may structurally support the coarse stage 208 to move up and down in the vertical Z direction, while the error in the X and Y directions are equal or smaller than +/−2.5 nanometers.

It is to be understood that the targets may comprise one or more target features 202 (e.g., according to the metrology recipe). It is to be understood that an overlay target may generally be formed from any number of cells and that any particular cell may include a grating-over-grating feature with a periodicity along any direction. For example, the sample 102 may include an overlay target formed from one or more cells, each cell including a grating-over-grating structure formed from grating structures on two layers of the sample 102 according to a metrology recipe (as shown in FIG. 2A). For example, a target may comprise a higher target feature 202a and a lower target feature 202b. However, it is to be understood that a target of a sample 102 is not limited by the descriptions and figures herein. For example, a target may include target features 202 on any number of layers of the sample 102 (e.g., 3 layers, 4, layers, 150 layers, or the like). By way of another example, target features 202 may be oriented in any selected pattern suitable for image-based metrology measurements (e.g., overlay metrology measurements). By way of another example, overlay targets may include, but are not limited to, a box-in-box (BiB) pattern, a circle-in-circle pattern, a grating-over-grating pattern, a grating beside grating pattern, non-periodic patterns, 1-D targets, advanced imaging metrology (AIM) overlay targets, TAIM overlay targets, AIMid overlay targets, and any other overlay target.

Referring now to the metrology system 100 generally, in embodiments the imaging system 104 is configured to image wafer to wafer (W2W) bonded samples and the sample 102, in accordance with the metrology recipe, is a W2W bonded sample 102.

In other embodiments the imaging system 104 is configured to image die to wafer (D2W) bonded samples and the sample 102, in accordance with the metrology recipe, is a D2W bonded sample 102.

By way of another example, an overlay target 202 (e.g., BiB pattern, AIM targets, and the like) may include D2W overlay targets where the XY position of a die feature 202 in a higher layer is overlapping (e.g., equal (concentric)) with the XY position of a wafer feature 202 in a lower layer. In such an example, the required focal plane adjustment distance between the higher target feature 202a and the lower target feature 202b may be on the order of hundreds of microns (e.g., at least 200 microns).

By way of another example, an overlay target 202 (e.g., BiB pattern, AIM targets, and the like) may include D2W overlay targets where the XY position of a die feature 202 in a higher layer is not equal (non-overlapping, side-by-side, and the like) with the XY position of a wafer feature 202 in a lower layer. In such an example, the required focal plane adjustment distance between the higher target feature 202a and the lower target feature 202b may be on the order of hundreds of microns (e.g., at least 200 microns).

By way of another example, an overlay target 202 (e.g., with overlapping features of different layers) may include W2W targets. In such an example for hybrid bonding of the wafers, the required focal plane adjustment distance between the higher target feature 202a and the lower target feature 202b may typically be low (e.g., a few microns). However, it is contemplated herein that the present disclosure may, in some embodiments, enable tall metrology of a W2W sample when the W2W sample is configured to be made with additional lithography steps or with additional through silicon via (TSV) steps such that the required focal plane adjustment distance between features 202 is larger than in a typical hybrid bonded W2W sample. For instance, a method step or system 100 may be configured to generate a metrology measurement on a W2W sample 102 with at least one of additional lithography steps or additional TSV steps such that the sample requires tall metrology (e.g., at least 20 microns vertical adjustment), according to a metrology recipe.

The coarse stage 208 may be driven by a coarse stage drive 214. The coarse stage drive 214 may be any drive that provides a maximum coarse adjustment (e.g., distance measured between focal planes) of (or associated with) the coarse stage 208. For example, the coarse stage drive 214 may be a linear motor. In another example, the coarse stage drive 214 may be a combination of rotary motor that turns a drive screw that drives, either directly or indirectly, the coarse stage 208 through a range of coarse stage axial adjustment distances (measured as a distance that the coarse stage moves along the optical axis). The coarse stage drive 214 may be configured to provide a large range of coarse stage axial adjustment distances to the coarse stage 208 that correspond to a large maximum coarse adjustment (e.g., distance between focal planes) (e.g., larger than a maximum fine adjustment). For example, the coarse stage drive 214 may provide (e.g., provide at least) 50 microns, 500 microns, 2000 microns (2 millimeters), or the like of maximum coarse adjustment relative to a normal surface of the sample 102 and/or a direction parallel to the optical axis 210. It should be noted that a combination of the air bearings 206 and the large maximum coarse adjustment of a coarse stage drive 214 may allow for a relatively accurate (e.g., reduced misalignment of a field of view) metrology system 100 capable of tall metrology. In some embodiments, the addition of one or more proximity sensors allows for at least one of even more accurate and/or even taller metrology, described in more detail throughout this disclosure.

In another embodiment, a stage element (e.g., the fine stage 212 and/or an objective lens 218, or other stage element) may be supported by two or more thin flexure arms 216. For example, the thin flexure arms 216 may be configured to allow for a fine movement of the fine stage 212 along the optical axis 210, and constrain a lateral translation and a tilt of the fine stage relative to the optical axis 210. For instance, such a fine movement may be a movement of the objective positioning stage to two or more objective locations along the optical axis and may provide for an adjustment (e.g., changing focal plane height to focus an image of a feature 202 of the sample 102) of two or more focal planes of the one or more detectors of the imaging system 104.

It should be noted that, in some embodiments, each focal plane of the two or more focal planes may be defined as being at an axial position along the optical axis of the metrology system and orthogonal to the optical axis. For example, the focal plane may further be defined as the plane to be imaged in focus by one or more detectors positioned to capture images at an image plane conjugate to the focal plane. For instance, an objective positioning stage may be used to adjust an axial position of an objective lens such that the focal plane is moved while the conjugate image plane of the one or more detectors may, in some embodiments, not move. In this regard, the coarse stage drive 214 and/or a fine stage drive 220 of the object positioning stage may be configured to move a stage element (e.g., the fine stage 212, the coarse stage 208, or the like) longitudinally along the optical axis 210 to adjust an axial position of a focal plane of the one or more detectors.

Continuing the above example, or, alternatively, in another example, the thin flexure arms 216 may be flexible and be positioned in a pattern that constrains (e.g., within a few (e.g., three or five) nanometers or microradians) a stage element (e.g., fine stage 212) from being misaligned relative to the optical axis 210 (or a field of view). For instance, the thin flexure arms 216 may be in a parallelogram configuration as shown in FIG. 2A, with at least two thin flexure arms 216 on each side of the optical axis supporting the stage element. In this regard, the two or more thin flexure arms 216 may include a first subset of two or more thin flexure arms on a first side of the fine stage, and a second subset of two or more thin flexure arms on a second side of the fine stage, wherein the second side is opposite the first side relative to the optical axis 210.

Continuing the above example, or, alternatively, in another example, the thin flexure arms 216 may allow for a maximum fine adjustment (measured between focal planes) of (or associated with) a stage element of 20 microns or more. For instance, the thin flexure arms 216 may allow for a maximum fine adjustment of at least (or up to) 50 microns. In another instance, the thin flexure arms 216 may allow for maximum fine adjustment of 100 microns, or higher. Benefits of the thin flexure arms 216, in at least some embodiments, include one or more of a relatively large maximum fine adjustment, tight alignment tolerances (i.e., lateral shift and tilt), relatively fast adjustment using a drive (e.g., fine stage drive 220 such as a piezoelectric device (PZT) drive), and repeatable misalignment error that may be calibrated for. For example, an alignment error of the coarse stage 208 may not be repeatable (e.g., random), compared to the alignment error of the fine stage (e.g., due to repeatability/predictability of thin flexure arms). For instance, the fine stage may follow a predictable misalignment path/profile during movement, which may be measured by the one or more proximity sensors, and which may be stored in memory and used in the future (e.g., without measuring the misalignment) to predict the misalignment of the fine stage and correct for (or prevent mechanically) an inaccuracy in a metrology measurement. For example, a misalignment of five nanometers in an X-direction may be predicted using a calibrated fine stage when the fine stage is at an axial position of 10 microns. For instance, this misalignment may be corrected for mathematically or mechanically as described in more detail throughout this disclosure. In another instance, the fine stage drive 220 may be a piezoelectric device (PZT) configured to produce motion of the fine stage when an electric voltage is applied to the PZT, where the PZT may be operationally coupled and structurally coupled to the fine stage.

It should be noted that "correct the overlay error", "correct the metrology measurement", and like terminology (e.g., "at least partially" correct the metrology measurement) may mean to "correct for an error/inaccuracy in the metrology measurement" (e.g., because the metrology measurement may be an estimate of a real-world measurement of misalignment of two or more target features 202 (or location or size of one or more target features 202), which is limited in accuracy by the alignment and accuracy of the imaging system 104). Therefore, "correct the metrology measurement" and like terminology does not necessarily mean to physically correct a misregistration/flaw of the layers of the sample 102 (i.e., physically reworking the sample 102). Rather, "correct the metrology measurement" and the like may mean to correct an inaccuracy in the metrology measurement (e.g., value/term). However, it should be noted, in an optional configuration/step, a corrected metrology measurement could be used to physically correct for (i.e., rework) a flaw (e.g., overlay error) in the sample 102 or to prevent future flaws, thereby increasing yield and/or efficiency in the manufacturing process.

In one embodiment, the metrology system 100 may be configured to receive one or more first measurement images of the one or more first target features 202 (e.g., higher target feature 202a) on the sample captured by the detector at an initial detector focal position of the two or more focal positions. For example, the metrology system 100 may include a controller 106 including one or more processors 110 configured to execute program instructions causing the one or more processors 110 to execute the metrology recipe by: receiving one or more first measurement images of the one or more first target features 202a on the sample 102 captured by the detector at an initial detector focal position (e.g., as shown in FIG. 2A and FIG. 3A) of the two or more focal positions. The initial detector focal position may be the focal position shown in FIG. 2A (or FIG. 3A), and may be the focal position that allows for a focused image of the higher target feature 202a as shown in FIG. 2A (or FIG. 3A).

Continuing the above example, the metrology system 100 may be configured to measure the lateral shift and/or the tilt of a stage element (e.g., coarse stage 208, fine stage 212, and the like) before and/or after adjusting a focal position of a stage element. For example, the controller 106 may further be configured to execute program instructions causing the one or more processors 110 to execute the metrology recipe by: measuring/receiving one or more first lateral positions of the stage element relative to the optical axis of the imaging system using the one or more proximity sensors when the stage element is in the initial detector focal position. The measured lateral shift and/or tilt of the stage element may be used to at least partially correct (or prevent) an inaccuracy in a metrology measurement (e.g., mathematically and/or mechanically).

Continuing the above example, the metrology system 100 may be configured to measure one or more first lateral positions of a stage element (e.g., coarse stage 208) of the imaging system 104 using one or more proximity sensors 222 when the stage element is in the initial detector focal position. For example, the one or more first lateral positions may include (or be derived from) proximity sensor gap 224a measurements shown in FIG. 2A. For example, the controller 106 may further be configured to execute program instructions causing the one or more processors 110 to execute the metrology recipe by: receiving one or more first lateral positions of the stage element relative to the optical axis 210 of the imaging system 104 using the one or more proximity sensors 222 when the stage element is in the initial detector focal position.

Continuing the above example, the metrology system 100 may be configured to adjust a focal position of at least one of the one or more detectors by moving the stage element an axial adjustment distance from the initial detector focal position to a secondary detector focal position. For example, note how at least the coarse stage 208 is lower in FIG. 2B, FIG. 2C, FIG. 3B, FIG. 3C than it is in FIG. 2A and FIG. 3A. A lower position may correspond to a lower focal plane position of a detector for capturing (e.g., in focus) one or more target features 202 (e.g., lower target feature 202*b* of FIG. 2B or FIG. 3B) according to a metrology recipe. For example, the controller 106 may further be configured to execute program instructions causing the one or more processors 110 to execute the metrology recipe by: adjusting a focal position of at least one of the one or more detectors by moving the stage element an axial adjustment distance along the optical axis 210 from the initial detector focal position to a secondary detector focal position.

Continuing the above example, the metrology system 100 may be configured to measure one or more second lateral positions of the stage element using the one or more proximity sensors 222 when the stage element is in the secondary detector focal position. For example, the one or more second lateral positions may include (or be derived from) proximity sensor gap 224*b* measurements of FIG. 2B or FIG. 3B. Note that proximity sensor gap 224*a* is smaller than proximity sensor gap 224*b*. The difference between one or more proximity sensor gap 224*a* and one or more proximity sensor gap 224*b* may be used to determine a lateral shift and/or tilt of a stage element (e.g., a coarse stage 208) of imaging system 104. For example, the controller 106 may further be configured to execute program instructions causing the one or more processors 110 to execute the metrology recipe by: receiving one or more second lateral positions of the stage element relative to the optical axis using the one or more proximity sensors when the stage element is in the secondary detector focal position.

Continuing the above example, the metrology system 100 may be configured to receive one or more second measurement images of one or more second target features 202 (e.g., lower target feature 202*b*) on the sample 102 captured at the secondary detector focal position. For example, the controller 106 may further be configured to execute program instructions causing the one or more processors 110 to execute the metrology recipe by: receiving one or more second measurement images of one or more second target features 202 (e.g., lower target features 202*b*) on the sample 102 captured by at least one of the one or more detectors at the secondary detector focal position.

Continuing the above example, the metrology system 100 may be configured to determine at least one of: a measured stage element lateral shift of the stage element based on at least the one or more first lateral positions and the one or more second lateral positions; or a measured stage element tilt of the stage element based on at least the one or more first lateral positions and the one or more second lateral positions. For example, the controller 106 may further be configured to execute program instructions causing the one or more processors 110 to execute the metrology recipe by: determining at least one of: a measured stage element lateral shift of the stage element based on at least the one or more first lateral positions and the one or more second lateral positions; or a measured stage element tilt of the stage element based on at least the one or more first lateral positions and the one or more second lateral positions. For example, the determining may be based on a known configuration of the imaging system 104 such that accurate lateral shift and/or tilt determinations may be made based on one or more lateral position measurements 224 using the one or more proximity sensors.

Continuing the above example, the metrology system 100 may be configured to determine a metrology measurement between two or more layers of the sample 102 based on the one or more first measurement images and the one or more second measurement images according to a metrology recipe. For example, a first feature (e.g., grating) of a target 202 of a first measurement image captured at the initial detector focal position in a first layer of the sample 102 may be compared by a processor 110 to a second grating of a second measurement image captured in a second layer of the sample 102 (e.g., at a different, secondary focal position) to determine the metrology measurement between an ideal, designed-for alignment of the two layers and the measured misalignment of the two layers. As noted throughout this disclosure, the metrology measurement may itself be inaccurate due to, for example, but not limited to, inaccuracies in the alignment of stage elements of the imaging system 104. For example, the controller 106 may further be configured to execute program instructions causing the one or more processors 110 to execute the metrology recipe by: determining a metrology measurement between two or more layers of the sample 102 based on the one or more first measurement images and the one or more second measurement images.

Optionally, the metrology system 100 may be configured to correct, at least partially, the metrology measurement using at least one of the measured stage element lateral shift or the measured stage element tilt. For example, an inaccuracy in the metrology measurement may be at least partially corrected mathematically or (prevented) mechanically. For instance, by receiving the lateral shift of a stage element (e.g., coarse stage) during a change in focal position, the shift and/or tilt of the stage element may be determined and used to mathematically adjust/update/correct the metrology measurement to compensate for inaccuracies of the metrology measurement caused by the shift and/or tilt of the stage element. In this regard, an updated metrology measurement may be determined in accordance with the metrology recipe. In another instance, the lateral shift and/or tilt may be at least partially prevented (or corrected for (e.g., compensated for)) mechanically by a fine adjustment stage 226 (as shown in FIG. 2A) and/or a coarse adjustment stage 228 (as shown in FIG. 3A). The fine adjustment stage 226 and/or the coarse adjustment stage 228 may be capable of adjusting the angle/tilt and/or lateral position of a stage element to at least partially compensate for misalignments of stage elements (e.g., misalignment due to a change in focal position of a stage element and/or jitter over time). It should be noted that the mechanical adjustment described above may be performed before the one or more second measurement images are captured such that the determined metrology measurement is already corrected for (prevented) and may not need to be mathematically adjusted/updated/corrected. It should also be noted in some embodiments a combination of mathematically and mechanically correcting for misalignment may be performed by a combination of an adjustment stage (e.g., fine adjustment stage), and one or more proximity sensors. For example, the one or more proximity sensors may adjust for an initial proximity sensor gap 224*a* but by the time the adjustment stage mechanically adjusts an element to at least partially correct for the measured proximity sensor gap 224*a*, jitter occurring over time may have added additional misalignment to the system. Using measured additional proximity sensor gap measurements (e.g., proximity sensor gap 224*c* of FIG. 2C) measured at or near the time new (e.g., second) measurement images are received, the metrology measurement associated with those new measurement images may be further corrected for mathematically.

It should be noted that FIGS. 2A through 3C are for illustrative purposes only and the position of the proximity sensors 222 may be in any number of locations configured to measure a lateral position of a stage element. For example, the proximity sensors 222 may be located within or adjacent to the frame 204 such that they may measure a position of, for example, the coarse stage 208. In another example, the proximity sensors 222 may be located in a position to measure the lateral position of the fine stage 212, such as within or adjacent to the coarse stage 208. The proximity sensors 222 may be structurally coupled to any element that provides for measuring a lateral position of a stage element. For example, the proximity sensors 222 may be structurally coupled to the frame, the coarse stage, or any other element of the metrology system 100. The proximity sensors 222 may be positioned so as to measure more than one direction of misalignment of a stage element (e.g., both a lateral X and Y direction of a stage element).

Referring now to FIGS. 2A though 2C, a metrology system that at least partially corrects for and/or prevents misalignment of stage elements is generally described in regards to the fine adjustment stage 226.

It should be noted that, in some embodiments, the objective positioning stage is any element of the metrology system that is configured for positioning of the objective lens or an element closely related, structurally, thereto. For example, the objective positioning stage may include at least one of a fine stage or a coarse stage. In another example, the objective positioning stage may include at least one of a fine stage, a coarse stage, a fine stage drive, a coarse stage drive, a fine adjustment stage, a coarse adjustment stage, a frame, air bearings, or thin flexure arms.

It should be noted that the fine adjustment stage 226 is shown disposed between the objective lens 218 and the fine stage 212, but may be located in any number of places that allow for adjustment/movement of, ultimately, the objective lens 218 or other stage element affecting focus. For example, the fine adjustment stage 226 may be located/disposed between the fine stage drive 220 and the fine stage 212. For instance, such a location (not shown) may allow for the fine adjustment stage 226 to correct for a calibrated fine stage misalignment by mechanically moving the fine stage to adjust for a lateral shift and/or tilt. In this regard, the objective lens 218 may move together with the fine stage 212 and likewise be mechanically aligned.

FIG. 2A illustrates a diagrammatic representation of an imaging system in a first position, in accordance with one or more embodiments of the present disclosure. FIG. 2B illustrates a diagrammatic representation of the imaging system in a second misaligned position, in accordance with one or more embodiments of the present disclosure. FIG. 2C illustrates a diagrammatic representation of the imaging system in a third position which is at least partially corrected by a fine adjustment stage, in accordance with one or more embodiments of the present disclosure.

For example, as described above, a measured lateral shift (e.g., measured stage element lateral shift) and/or measured tilt (e.g., measured stage element tilt) may be determined and used to determine how much to adjust/move a stage element (which may be a different stage element than the one measured or the same) (e.g., the coarse stage 208 and/or the objective lens 218) to at least partially prevent (or correct for) the measured lateral shift and/or measured tilt. In this regard, a measured lateral shift of 20 nanometers in a positive radial X-direction may be corrected for by moving the objective lens in a negative radial X-direction 20 nanometers. For example, a metrology measurement may be theoretically perfectly accurate if all misalignments are measured and fully mechanically corrected by an adjustment stage (e.g., the fine adjustment stage 226) before one or more measurement images are taken. The adjustment stages may perform the adjusting through any means of movement which may be included (e.g., actuators, motors, PZTs, and the like).

It should be noted that the fine adjustment stage 226 may be operationally and/or structurally coupled to the fine stage 212 and/or the objective lens 218 (e.g., structurally between the fine stage 212 and the objective lens 218). As shown (e.g., FIG. 2C), the fine adjustment stage 226 may be configured to adjust a tilt and/or lateral shift of the objective lens 218 relative to the optical axis 210.

In some embodiments, similar to the fine adjustment stage 226, the coarse adjustment stage 228 may likewise be used to adjust the lateral shift and/or tilt of the frame 204 and/or coarse stage 208 to at least partially correct for a lateral shift and/or tilt of a stage element. For example, referring now to FIGS. 3A though 3C, a metrology system 100 that at least partially corrects for and/or prevents misalignment of stage elements is generally described in regards to the coarse adjustment stage 228.

FIG. 3A illustrates a diagrammatic representation of an imaging system in a first position, in accordance with one or more embodiments of the present disclosure. FIG. 3B illustrates a diagrammatic representation of the imaging system in a second misaligned position, in accordance with one or more embodiments of the present disclosure. FIG. 3C illustrates a diagrammatic representation of the imaging system in a third position which is at least partially corrected by a coarse adjustment stage 228, in accordance with one or more embodiments of the present disclosure.

For instance, as described above, a measured lateral shift and/or measured tilt may be determined and used to determine how much to adjust/move a stage element (e.g., frame 204; coarse stage 208) to at least partially prevent (or correct for) the measured lateral shift and/or measured tilt of a stage element. In this regard, FIG. 3C may be an illustration of a diagrammatic representation of an imaging system 104 after an adjustment of a lateral position (e.g., to compensate for a lateral shift) and a tilt (e.g., to compensate for a tilt) of a stage element (e.g., the frame 204, the coarse stage 208, or the like).

It should be noted that the "correct, at least partially" steps/operations and the like throughout this disclosure through mechanical adjustment stages (e.g., coarse adjustment stage 228 and/or fine adjustment stage 226) may occur before the "measure one or more" images (e.g., secondary images) steps/operations and the like, such that, alignment of, e.g., second measurement images are already at least partially corrected for (e.g., the misalignment of stage elements is corrected for) before the "metrology measurement" steps/operations and the like are determined; thus, an inaccuracy of the "metrology measurement" may be already "at least partially correct[ed]" (e.g., prevented), without necessarily a need for another "correct" step/operation.

In some embodiments, the imaging system 104 may include one or more detectors for imaging one or more target features 202 according to a metrology recipe. For example, the one or more proximity sensors may be configured to measure lateral positions of a stage element as the objective positioning stage moves along the optical axis and/or a focal plane axial position is adjusted. For example, a detector may be the detector assembly 122 of FIG. 2B. In another example, a detector may include one or more pixel sensors (e.g., 2D sensor, camera, focal plane array (FPA), or the like). One or more of the stage elements described herein (e.g., any element of the imaging system 104) may be configured to be used to determine an axial position of a focal plane of the one or more detectors of the imaging system 104. It should be noted that the axial position of sample 102 within the imaging system 104 may be controlled using any combination of elements. For example, the axial position of the sample 102 may be adjusted via the sample stage 108 (e.g., according to a metrology recipe). By way of another example, the focal position of the sample 102 may be controlled by adjusting a position of one or more elements of the collection pathway 142 (see FIG. 1B) such as, but not limited to, the objective lens 124 (which may be objective lens 218 of FIG. 2B).

It should be noted that each detector of the one or more detectors may have a separate, maximum focal plane adjustment distance. For example, higher target feature 202a may require a detector imaging at a higher focal plane and lower target feature 202b may require a detector (e.g., the same detector or a different detector) imaging at a lower focal position in order to image each target feature 202 in focus. The difference between the higher focal plane and the lower focal plane may be a maximum focal plane adjustment distance, which may be measured (e.g., vertically) relative to target features (i.e., rather than the distance the stage/optical element moved). For example, the stage element may move an axial distance that is larger or smaller than the focal plane adjustment distance between the two focal planes. In one example, each detector may be configured to capture images through an objective lens 218 at two or more focal planes along an optical axis 210 of the imaging system 104, wherein the focal plane of one detector may be different than the focal plane of another detector.

It should be noted that the objective lens 218 throughout this disclosure may mean an objective lens subsystem including one or more stage/optical elements (e.g., lenses).

Figure 1C:
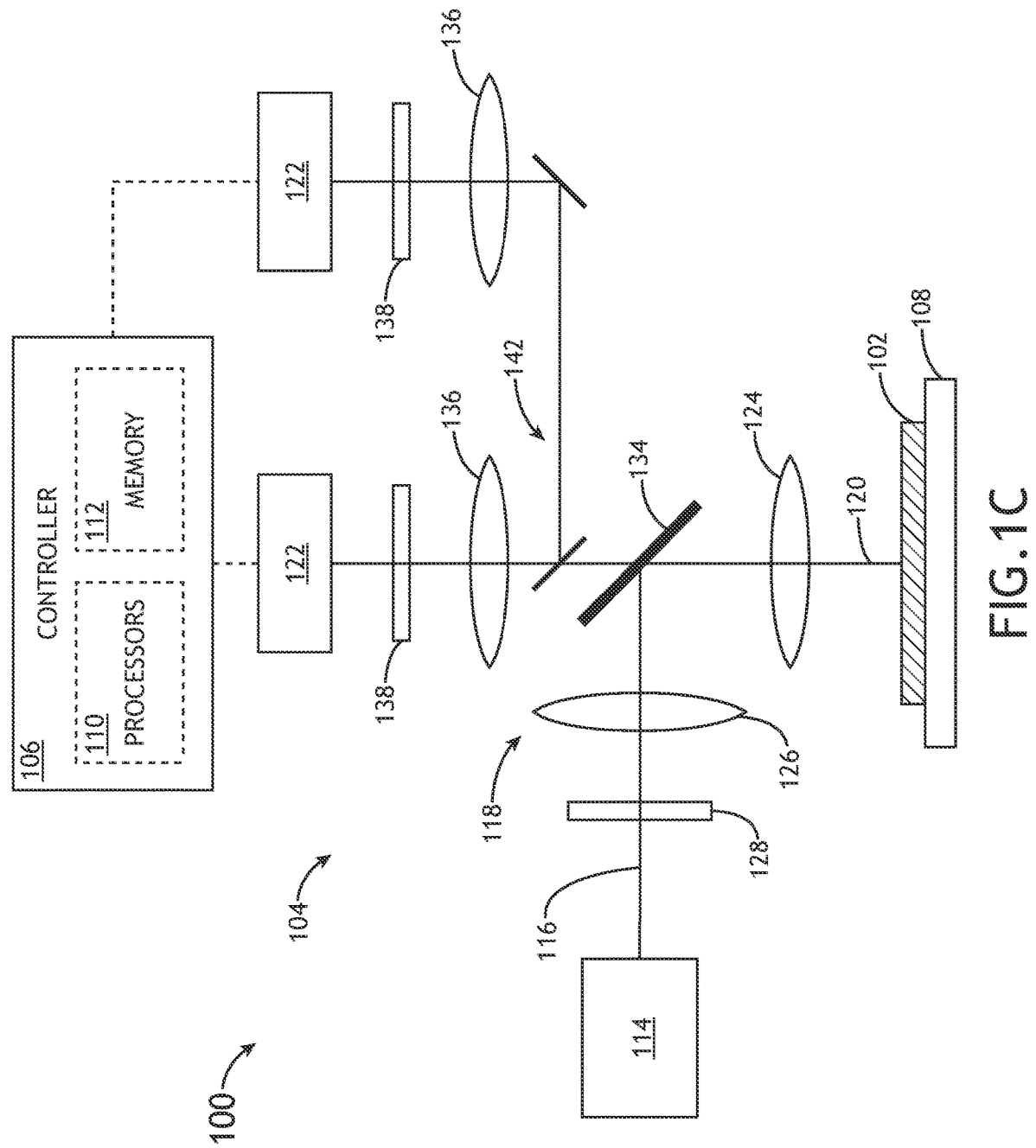
FIG. 1C illustrates a diagrammatic representation of a metrology system with two or more detectors, in accordance with one or more embodiments of the present disclosure.

FIG. 1C illustrates a diagrammatic representation of a metrology system with two or more detectors, in accordance with one or more embodiments of the present disclosure.

In some embodiments, the one or more detectors are two or more detectors 122. For example, the imaging system 104 may include at least two detectors 122, such as a first detector 122 and a second detector 122, as shown in FIG. 1C. For example, one or more beam splitters 134 may be used to split the collection pathway 142 into two or more channels with at least one detector 122 in each channel, as shown in FIG. 1C. For example, the metrology system 100 may be a dual detector (e.g., dual camera) system, where the first detector 122 may capture images of a first target feature 202a in a first focal plane and, without moving the first focal plane, the second focal plane of the second detector 122 may be adjusted to capture images of a second target feature 202b. In this regard, a dual detector imaging system 104 may allow for efficient/fast/simultaneous image capture of many target features (e.g., tall targets) when combined with at least some of the benefits of this disclosure. For example, air bearings 206, proximity sensors 222, and/or adjustment stages (e.g., coarse adjustment stage 228) combined with two detectors may allow for fast, efficient, and/or accurate determination of metrology measurement of tall targets (e.g., height difference of at least 20, 50, 100, 500, 1000, or 2000 microns). For instance, at least one of a larger maximum focal plane adjustment distance or a more accurate metrology measurement may be achieved by such a combination.

In one embodiment, the metrology system with two or more detectors is configured to determine a new metrology measurement based on one or more new first images and one or more new second images. For example, the new metrology measurement may be combined with a metrology measurement (e.g., first metrology measurement) to obtain a more accurate metrology measurement.

In another embodiment, the metrology system with two or more detectors is configured to determine an average overall metrology measurement based on the new metrology measurement and the metrology measurement, such that the average overall metrology measurement has an improved signal to noise ratio compared to the metrology measurement. For example, a dual detector metrology system may be configured to obtain the metrology measurement multiple times and average the metrology measurements to obtain a single metrology measurement (e.g., average overall metrology measurement) with an improved signal to noise ratio.

In one example, the controller 106 is further configured to execute program instructions causing the one or more processors to execute the metrology recipe by also: determining a new metrology measurement based on one or more new first measurement images and one or more new second measurement images (e.g., using the operations/configurations/steps described above to obtain a metrology measurement); and determining an average overall metrology measurement based on the new metrology measurement and the metrology measurement, such that the average overall metrology measurement has an improved signal to noise ratio compared to the metrology measurement. For instance, a dual camera metrology system 100 may allow for efficiently capturing measurement images of various target features in various layers of a sample by virtue of a detector that stays at or near a focal height corresponding to lower target features 202a and a second detector that stays at or near a focal height corresponding to higher target features 202b, such that the time and distance a detector must move is reduced. Further, multiple metrology measurements may be determined and averaged such that the signal to noise ratio (SNR) of the average metrology measurement is improved (e.g., higher). Benefits include being able to efficiently perform tall metrology via a larger and/or faster focal range adjustment.

Referring again to FIG. 1A, it is noted herein that the one or more components of the metrology system 100 may be communicatively coupled to the various other components of the metrology system 100 in any manner known in the art.

In another embodiment, the determining the metrology measurement associated with the target on the sample 102 using the images and the lateral positions comprises: determining the metrology measurement based on a relative location of the features 202 on the two or more focal planes using the images; and correcting the metrology measurement by compensating for lateral shifts of the objective positioning stage between the two or more objective locations.

In another embodiment, the objective positioning stage is further configured to adjust at least one of a lateral position or a tilt of the objective lens 218, wherein determining the metrology measurement associated with the target on the sample 102 using the images and the lateral positions comprises: adjusting at least one of the lateral position or the tilt of the objective lens 218 using the objective positioning stage based on the lateral positions of the objective positioning stage to align fields of view of the images captured at the two or more objective locations within a selected tolerance prior to capturing the images; and determining the metrology measurement based on relative location of the features 202 on the two or more focal planes using the images.

In another embodiment, the controller 106 includes one or more processors 110 configured to execute program instructions maintained on a memory medium 112. In this regard, the one or more processors 110 of controller 106 may execute any of the various process steps described throughout the present disclosure. Further, the controller 106 may be communicatively coupled to any component of the metrology system 100. For example, the controller 106 may be communicatively coupled to the imaging system 104 to receive images from the imaging system 104 and/or control the adjustable components of the imaging system 104 to align the sample 102 within selected alignment tolerances. Further, the controller 106 may determine a metrology measurement associated with two or more layers of the sample 102 based on measurement images received from the imaging system 104.

Referring now to the metrology system 100 in the context of overlay metrology. In some embodiments, as may be applied to the various embodiments and examples of this disclosure, the metrology system is an overlay metrology system, the metrology measurement is an overlay error, the target is an overlay target, and the features are overlay features, according to a metrology recipe. For example, the features 202a and features 202b in FIGS. 2A through 3C may be overlay target features 202 (e.g., in a grating over grating overlay metrology recipe).

In one embodiment, the metrology system 100 is a 3D overlay metrology system 100 configured to scan (capture images, receive detection signals) as a focal plane axial position of one or more detectors is adjusted in a Z direction along the optical axis. For example, a 3D overlay error (misregistration in the X, Y, and Z direction) is generated/determined based on received multiple detection signals along multiple focal planes. Further, as described in relation to a metrology measurement throughout this disclosure, the inaccuracy of 3D overlay error may be at least partially corrected for (or prevented) mathematically and/or mechanically.

FIG. 4 illustrates a flowchart of a method 400 for overlay metrology, in accordance with one or more embodiments of the present disclosure. It is noted herein that the steps of method 400 may be implemented all or in part by metrology system 100. It is further recognized, however, that the method 400 is not limited to the metrology system 100 in that additional or alternative system-level embodiments may carry out all or part of the steps of method 400.

In a step 402, lateral positions of a stage element of a metrology system 100 obtained from one or more proximity sensors are received. For example, the lateral positions may be measured relative to an optical axis.

In a step 404, images of two or more focal planes are received via movement of the objective positioning stage to the two or more objective locations along an optical axis.

In a step 406, a metrology measurement associated with a target on a sample is determined using the images and lateral positions of the stage element when the objective positioning stage is at the two or more objective locations, the target including features on the two or more focal planes.

Referring now to the metrology system 104 generally, various components are described in more detail below.

The one or more processors 110 of a controller 106 may include any processing element known in the art. In this sense, the one or more processors 110 may include any microprocessor-type device configured to execute algorithms and/or instructions. In one embodiment, the one or more processors 110 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 112. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into metrology system 100. Further, the controller 106 may analyze data received from the detector assembly 122 and feed the data to additional components within the metrology system 100 or external to the metrology system 100.

The memory medium 112 may include any storage medium known in the art suitable for storing program instructions executable by the associated one or more processors 110. For example, the memory medium 112 may include a non-transitory memory medium. By way of another example, the memory medium 112 may include, but is not limited to, a read-only memory, a random access memory, a magnetic or optical memory device (e.g., disk), a magnetic tape, a solid state drive and the like. It is further noted that memory medium 112 may be housed in a common controller housing with the one or more processors 110. In one embodiment, the memory medium 112 may be located remotely with respect to the physical location of the one or more processors 110 and controller 106. For instance, the one or more processors 110 of controller 106 may access a remote memory (e.g., server), accessible through a network (e.g., internet, intranet and the like). Therefore, the above description should not be interpreted as a limitation on the present invention but merely an illustration.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effec- tively "associated" such that the desired functionality is achieved. Hence, any two components herein combined to achieve a particular functionality can be seen as "associated with" each other such that the desired functionality is achieved, irrespective of architectures or intermedial com- ponents. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly inter- actable and/or wirelessly interacting components and/or logically interacting and/or logically interactable compo- nents.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "includ- ing but not limited to," the term "having" should be inter- preted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the fol- lowing appended claims may contain usage of the introduc- tory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a con- vention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

We claim:

1. A metrology system comprising:

an objective lens;

one or more detectors;

an objective positioning stage structurally coupled to the objective lens and configured to adjust a focal plane of at least one of the one or more detectors via movement along an optical axis, the metrology system comprising the optical axis; and one or more proximity sensors configured to measure lateral positions of a stage element as the objective positioning stage moves along the optical axis, the lateral positions measured relative to the optical axis and in directions orthogonal to the optical axis when the objective positioning stage is at each of two or more objective locations, wherein the metrology system is configured to capture images of two or more focal planes via movement of the objective positioning stage to two or more objective locations along the optical axis, each focal plane of the two or more focal planes at an axial position along the optical axis of the metrology system and orthogonal to the optical axis, wherein at least two of the two or more focal planes are separated by an axial focal distance apart that is greater than a depth of field provided by the objective lens, wherein the metrology system is configured to determine a metrology measurement associated with a target on a sample using the images and the lateral positions of the stage element when the objective positioning stage is at the two or more objective locations when implementing a metrology recipe, the target including features on the two or more focal planes according to the metrology recipe, wherein determining the metrology measurement comprises compensating for at least one of lateral shift or tilt of the objective positioning stage between the two or more objective locations using the measured lateral positions.

2. The system of claim 1, wherein determining the metrology measurement associated with the target on the sample using the images and the lateral positions comprises:

determining the metrology measurement based on a relative location of the features on the two or more focal planes using the images; and correcting the metrology measurement by compensating for lateral shifts of the objective positioning stage between the two or more objective locations.

3. The system of claim 1, wherein the objective positioning stage is further configured to adjust at least one of a lateral position or a tilt of the objective lens, wherein determining the metrology measurement associated with the target on the sample using the images and the lateral positions comprises:

adjusting at least one of the lateral position or the tilt of the objective lens using the objective positioning stage based on the lateral positions of the objective positioning stage to align fields of view of the images captured at the two or more objective locations within a selected tolerance prior to capturing the images; and determining the metrology measurement based on a relative location of the features on the two or more focal planes using the images.

4. The system of claim 1, wherein the objective positioning stage comprises at least one of a fine stage or a coarse stage, wherein the fine stage is structurally coupled to the objective lens, the objective positioning stage configured to allow for a fine movement of the fine stage along the optical axis corresponding to a fine adjustment of the focal plane of the one or more detectors, wherein the coarse stage is structurally coupled to at least one of the fine stage or the objective lens, the objective positioning stage configured to allow for a coarse movement of the coarse stage along the optical axis corresponding to a coarse adjustment of the focal plane of the one or more detectors, wherein a maximum focal plane adjustment distance of the objective positioning stage comprises at least one of a maximum fine adjustment of the fine stage or a maximum coarse adjustment of the coarse stage.

5. The system of claim 1, wherein, in accordance with the metrology recipe, at least one of two or more layers of the sample comprise one or more 3D NAND features.

6. The system of claim 1, wherein the metrology system is configured to image wafer to wafer (W2W) bonded samples and the sample, in accordance with the metrology recipe, is a W2W bonded sample.

7. The system of claim 1, wherein the metrology system is configured to image die to wafer (D2W) bonded samples and the sample, in accordance with the metrology recipe, is a D2W bonded sample.

8. The system of claim 1, wherein the metrology system is configured to image using at least one of: different illumination polarizations, different illumination numerical apertures, different illumination angles, or different illumination wavelength ranges.

9. The system of claim 1, wherein the one or more detectors comprise a first detector and a second detector, wherein the first detector is configured to capture first detector images at a first focal plane and the second detector is configured to capture second detector images at a second focal plane.

10. The metrology system of claim 1, wherein the metrology system is an overlay metrology system, the metrology measurement is an overlay error, the target is an overlay target, and the features are overlay features, according to the metrology recipe.

11. The system of claim 3, wherein the objective positioning stage is configured to adjust at least one of a lateral position or a tilt of the objective lens via an adjustment stage.

12. The system of claim 11, wherein the adjustment stage is at least one of a fine adjustment stage or a coarse adjustment stage, wherein the fine adjustment stage is operationally and structurally coupled to and configured to adjust at least one of a lateral position or a tilt of at least one of a fine stage or the objective lens, wherein the coarse adjustment stage is operationally and structurally coupled to and configured to adjust at least one of a lateral position or a tilt of a coarse stage.

13. The system of claim 4, wherein the objective positioning stage comprises the fine stage, wherein the fine stage is structurally supported radially about the optical axis by two or more thin flexure arms configured to allow for the fine movement of the fine stage along the optical axis, and constrain a lateral translation and a tilt of the fine stage relative to the optical axis when adjusting the focal plane of the one or more detectors.

14. The system of claim 4, wherein the stage element is the fine stage such that the one or more proximity sensors are configured to measure the lateral positions of the fine stage as the objective positioning stage moves along the optical axis.

15. The system of claim 4, wherein the objective positioning stage is configured to allow for the maximum fine adjustment of the fine stage to be at least 50 microns.

16. The system of claim 4, wherein the objective positioning stage comprises the fine stage and a fine stage drive, the fine stage drive operationally coupled to the fine stage and configured to provide for the fine movement of the fine stage along the optical axis corresponding to the fine adjustment of the focal plane.

17. The system of claim 4, wherein the objective positioning stage comprises the coarse stage and a coarse stage drive operationally coupled to the coarse stage and configured to provide for the coarse movement of the coarse stage along the optical axis corresponding to the coarse adjustment of the focal plane.

18. The system of claim 4, wherein the objective positioning stage is configured to allow for the maximum focal plane adjustment distance to be at least 2000 microns.

19. The system of claim 4, wherein determining the metrology measurement associated with the target on the sample using the images and the lateral positions comprises:
   determining a calibration of a repeatable lateral shift and/or tilt of the fine stage.

20. The system of claim 13, wherein the two or more thin flexure arms are located in a parallelogram configuration.

21. The system of claim 13, wherein the two or more thin flexure arms are configured to constrain the lateral translation to within five nanometers of accuracy and constrain the tilt to within three micro-radians of accuracy.

22. The system of claim 13, wherein the two or more thin flexure arms comprise a first subset of two or more thin flexure arms on a first side of the fine stage, and a second subset of two or more thin flexure arms on a second side of the fine stage, wherein the second side is opposite the first side relative to the optical axis.

23. The system of claim 16, wherein the fine stage drive is a piezoelectric device (PZT) configured to produce motion of the fine stage when an electric voltage is applied to the PZT, wherein the PZT is structurally coupled to the fine stage.

24. The system of claim 17, wherein the coarse stage is structurally supported radially about the optical axis by air bearings configured to allow for the coarse movement of the coarse stage along the optical axis, and constrain a lateral translation and a tilt of the coarse stage relative to the optical axis when adjusting the focal plane of the one or more detectors.

25. The system of claim 17, wherein the stage element is the coarse stage such that the one or more proximity sensors are configured to measure the lateral positions of the coarse stage as the objective positioning stage moves along the optical axis.

26. The system of claim 17, wherein the objective positioning stage is configured to allow for the maximum coarse adjustment of the coarse stage to be at least 500 microns.

27. The system of claim 17, wherein the objective positioning stage is configured to allow for the maximum coarse adjustment of the coarse stage to be at least 2000 microns.

28. The system of claim 19, correcting the metrology measurement using at least the calibration.

29. The system of claim 9, wherein the metrology system is further configured to:

determine a new metrology measurement based on one or more new first images and one or more new second images; and determine an average overall metrology measurement based on the new metrology measurement and the metrology measurement, such that the average overall metrology measurement has an improved signal to noise ratio compared to the metrology measurement.

30. A metrology system with air bearings comprising:

an objective lens;

one or more detectors;

an objective positioning stage structurally coupled to the objective lens and configured to adjust a focal plane of at least one of the one or more detectors via movement along an optical axis of the metrology system;

a coarse stage of the objective positioning stage, the coarse stage structurally supported radially about the optical axis by one or more air bearings configured to allow for a longitudinal movement of the coarse stage along the optical axis, and constrain a lateral translation and a tilt of the coarse stage relative to the optical axis when adjusting the focal plane of the one or more detectors; and one or more proximity sensors configured to measure lateral positions of the coarse stage relative to the optical axis and in directions orthogonal to the optical axis when the objective positioning stage is at each of two or more objective locations along the optical axis, wherein the metrology system is configured to capture images of two or more focal planes via movement of the objective positioning stage to two or more objective locations along the optical axis, each focal plane of the two or more focal planes at an axial position along the optical axis of the metrology system and orthogonal to the optical axis, wherein at least two of the two or more focal planes are separated by an axial focal distance apart that is greater than a depth of field provided by the objective lens, wherein the metrology system is configured to determine a metrology measurement associated with a target on a sample using the images and the measured lateral positions of the coarse stage when the objective positioning stage is at the two or more objective locations when implementing a metrology recipe, the target including features on the two or more focal planes according to the metrology recipe, wherein determining the metrology measurement comprises compensating for at least one of a lateral shift or a tilt of the coarse stage between the two or more objective locations using the measured lateral positions.

31. The system of claim 30, wherein the objective positioning stage is configured to allow for a maximum coarse adjustment of the coarse stage to be at least 500 microns.

32. The system of claim 30, wherein the one or more air bearings are configured to constrain the lateral translation to within five nanometers of accuracy and constrain the tilt to within five micro-radians of accuracy.

33. The system of claim 30, wherein the objective positioning stage comprises a coarse stage drive operationally coupled to the coarse stage and configured to provide for the coarse movement of the coarse stage along the optical axis corresponding to a coarse adjustment of the focal plane.

34. The system of claim 33,
   wherein the coarse stage drive comprises at least one of a linear motor operationally coupled to the stage element, or a rotary motor and drive screw combination operationally coupled to the stage element.

35. A method for overlay metrology, the method comprising:

receiving lateral positions of a stage element of a metrology system obtained from one or more proximity sensors, the lateral positions measured relative to an optical axis and in directions orthogonal to the optical axis when the objective positioning stage is at each of two or more objective locations, wherein the metrology system is configured to adjust a focal position of at least one of one or more detectors of the metrology system, wherein the metrology system is configured to capture images of two or more focal planes via movement of an objective positioning stage to two or more objective locations along the optical axis, each focal plane of the two or more focal planes at an axial position along the optical axis of the metrology system and orthogonal to the optical axis, wherein at least two of the two or more focal planes are separated by an axial focal distance apart that is greater than a depth of field provided by an objective lens;

receiving the images of the two or more focal planes via the movement of the objective positioning stage to the two or more objective locations along the optical axis; and determining a metrology measurement associated with a target on a sample using the images and the lateral positions of the stage element when the objective positioning stage is at the two or more objective locations, the target including features on the two or more focal planes, wherein determining the metrology measurement comprises compensating for at least one of lateral shift or tilt of the objective positioning stage between the two or more objective locations using the measured lateral positions.

36. The method of claim 35, wherein the determining the metrology measurement associated with the target on the sample comprises:

determining the metrology measurement based on a relative location of the features on the two or more focal planes using the images; and correcting the metrology measurement by compensating for lateral shifts of the objective positioning stage between the two or more objective locations using the received lateral positions.

37. The method of claim 35, wherein the objective positioning stage is further configured to adjust at least one of a lateral position or a tilt of the objective lens, wherein the determining the metrology measurement associated with the target further comprises:

adjusting at least one of the lateral position or the tilt of the objective lens using the objective positioning stage based on the lateral positions of the objective positioning stage to align fields of view of the images captured at the two or more objective locations within a selected tolerance prior to capturing the images; and determining the metrology measurement based on a relative location of the features on the two or more focal planes using the images.

* * * * *